(12) United States Patent
Sawczak et al.

(10) Patent No.: US 8,175,753 B2
(45) Date of Patent: May 8, 2012

(54) SYSTEMS AND METHODS FOR COMPUTER EQUIPMENT MANAGEMENT

(75) Inventors: Stephen D. Sawczak, Elizabeth, PA (US); Todd Komlenic, Beaver, PA (US); Michael Adams, Pittsburgh, PA (US)

(73) Assignee: The PNC Financial Services Group, Inc., Pittsburgh, PA (US)

( * ) Notice: Subject to any disclaimer, the term of this patent is extended or adjusted under 35 U.S.C. 154(b) by 214 days.

(21) Appl. No.: 12/378,424

(22) Filed: Feb. 13, 2009

(65) Prior Publication Data
US 2009/0210097 A1  Aug. 20, 2009

Related U.S. Application Data

(60) Provisional application No. 61/065,935, filed on Feb. 15, 2008.

(51) Int. Cl.
*G05D 23/00* (2006.01)
(52) U.S. Cl. ........ 700/276; 361/694; 361/695; 361/699; 454/184; 454/187
(58) Field of Classification Search .................. 700/276; 361/694, 695, 699; 454/184, 187
See application file for complete search history.

(56) References Cited

U.S. PATENT DOCUMENTS

| | | |
|---|---|---|
| 5,391,084 A | 2/1995 | Kreitzman |
| 5,460,006 A | 10/1995 | Torimitsu |
| 5,608,868 A | 3/1997 | Simon |

(Continued)

FOREIGN PATENT DOCUMENTS
EP  0 113 599 A  7/1984

OTHER PUBLICATIONS

Marko, Kurt, Processor Editorial Article entitled, "Three-Phase Power in Cabinet Increasing CPU Power Requirements & Server Densities Can Leave Old Power Distribution Designs Out of Juice", *Tech & Trends*, Oct. 19, 2007, vol. 29, Issue 42, accessed at http://www.processor.com/editorial/article.asp?article=articles%2Fp2942%2F31p42%2F31p42.asp.

(Continued)

*Primary Examiner* — Albert DeCady
*Assistant Examiner* — Anthony Whittington
(74) *Attorney, Agent, or Firm* — Robert J. Pugh; K&L Gates LLP

(57) ABSTRACT

Methods of managing computer equipment: the methods may comprise receiving data indicating a power dissipated by computer equipment in a portion of the server room and receiving data indicating an actual airflow through the portion of the server room. The methods may also comprise calculating a target airflow in the portion of the server room considering the power dissipated by computer equipment in the portion of the server room and an expected difference in temperature between at least one hot aisle and at least one cold aisle in the portion of the server room, and calculating a recommended action for reaching the target airflow. The recommended action may be selected from the group consisting of: changing a static pressure generated by at least one cooling unit servicing the portion of the server room; changing a number of perforated tiles present in the portion of the server room; and changing the type of one or more perforated tiles present in the portion of the server room. The methods may also comprise displaying the recommended action and/or implementing the recommended action.

27 Claims, 19 Drawing Sheets
(16 of 19 Drawing Sheet(s) Filed in Color)

U.S. PATENT DOCUMENTS

| | | | |
|---|---|---|---|
| 5,666,269 A * | 9/1997 | Romero et al. | 361/699 |
| 5,806,687 A | 9/1998 | Ballesteros et al. | |
| 5,835,700 A | 11/1998 | Carbonneau et al. | |
| 5,966,510 A | 10/1999 | Carbonneau et al. | |
| 5,997,117 A | 12/1999 | Kreitzman | |
| 6,088,816 A | 7/2000 | Nouri et al. | |
| 6,128,016 A | 10/2000 | Coelho et al. | |
| 6,185,098 B1 | 2/2001 | Benavides | |
| 6,247,898 B1 * | 6/2001 | Henderson et al. | 417/3 |
| 6,394,398 B1 | 5/2002 | Reed et al. | |
| 6,450,411 B1 | 9/2002 | Rash et al. | |
| 6,489,565 B1 | 12/2002 | Kreitzman et al. | |
| 6,501,020 B2 | 12/2002 | Grant et al. | |
| 6,504,100 B2 | 1/2003 | Lawrence | |
| 6,504,721 B1 * | 1/2003 | Watwe et al. | 361/700 |
| 6,557,357 B2 * | 5/2003 | Spinazzola et al. | 62/89 |
| 6,605,782 B1 | 8/2003 | Krietzman et al. | |
| 6,613,981 B1 | 9/2003 | Hathcock et al. | |
| 6,646,564 B1 | 11/2003 | Azieres et al. | |
| 6,664,985 B1 | 12/2003 | Bormann et al. | |
| 6,664,988 B1 | 12/2003 | Rollins | |
| 6,681,342 B2 | 1/2004 | Johnson et al. | |
| 6,690,575 B1 * | 2/2004 | Banton et al. | 361/690 |
| 6,697,255 B1 * | 2/2004 | Banton et al. | 361/690 |
| 6,708,293 B2 | 3/2004 | Kaler et al. | |
| 6,714,412 B1 * | 3/2004 | Chu et al. | 361/699 |
| 6,722,151 B2 * | 4/2004 | Spinazzola et al. | 62/259.2 |
| 6,755,493 B1 | 6/2004 | Krietzman et al. | |
| 6,786,056 B2 * | 9/2004 | Bash et al. | 62/199 |
| 6,814,244 B1 | 11/2004 | Hathcock | |
| 6,892,546 B2 | 5/2005 | Singh et al. | |
| 6,896,055 B2 | 5/2005 | Koithan | |
| 6,967,841 B1 * | 11/2005 | Chu et al. | 361/700 |
| 6,968,295 B1 | 11/2005 | Carr | |
| 6,973,801 B1 * | 12/2005 | Campbell et al. | 62/259.2 |
| 7,012,807 B2 * | 3/2006 | Chu et al. | 361/699 |
| 7,020,586 B2 | 3/2006 | Snevely | |
| 7,020,802 B2 | 3/2006 | Gross et al. | |
| 7,027,053 B2 | 4/2006 | Berndt et al. | |
| 7,027,301 B2 * | 4/2006 | Merlet | 361/695 |
| 7,086,247 B2 * | 8/2006 | Campbell et al. | 62/259.2 |
| 7,088,585 B2 * | 8/2006 | Chu et al. | 361/699 |
| 7,106,590 B2 * | 9/2006 | Chu et al. | 361/701 |
| 7,119,282 B2 | 10/2006 | Krietzman et al. | |
| 7,173,821 B2 * | 2/2007 | Coglitore | 361/695 |
| 7,184,269 B2 * | 2/2007 | Campbell et al. | 361/700 |
| 7,200,779 B1 | 4/2007 | Coss, Jr. et al. | |
| 7,237,086 B1 | 6/2007 | Kothandapani et al. | |
| 7,243,266 B2 | 7/2007 | Hiramatsu et al. | |
| 7,248,472 B2 * | 7/2007 | Vinson et al. | 361/694 |
| 7,259,961 B2 * | 8/2007 | Lucero et al. | 361/695 |
| 7,270,174 B2 * | 9/2007 | Chu et al. | 165/11.1 |
| 7,272,005 B2 * | 9/2007 | Campbell et al. | 361/699 |
| 7,274,566 B2 * | 9/2007 | Campbell et al. | 361/699 |
| 7,277,283 B2 * | 10/2007 | Campbell et al. | 361/699 |
| 7,298,617 B2 * | 11/2007 | Campbell et al. | 361/699 |
| 7,298,618 B2 * | 11/2007 | Campbell et al. | 361/699 |
| 7,313,717 B2 | 12/2007 | Vecoven et al. | |
| 7,373,278 B2 * | 5/2008 | Lanus | 702/185 |
| 7,392,309 B2 | 6/2008 | Childers et al. | |
| 7,400,504 B2 * | 7/2008 | Campbell et al. | 361/699 |
| 7,421,368 B2 * | 9/2008 | Dalton et al. | 702/130 |
| 7,452,236 B2 * | 11/2008 | Verdiell et al. | 439/540.1 |
| 7,511,960 B2 * | 3/2009 | Hillis et al. | 361/702 |
| 7,534,167 B2 * | 5/2009 | Day | 454/187 |
| 7,542,287 B2 * | 6/2009 | Lewis et al. | 361/695 |
| 7,672,811 B2 | 3/2010 | Xiao et al. | |
| 7,683,776 B2 | 3/2010 | Glenn et al. | |
| 7,694,188 B2 | 4/2010 | Raghuraman et al. | |
| 7,715,037 B2 | 5/2010 | Castellani et al. | |
| 7,730,364 B2 | 6/2010 | Chang et al. | |
| 7,765,286 B2 * | 7/2010 | Mark | 709/223 |
| 7,830,547 B2 | 11/2010 | Kolb et al. | |
| 7,865,764 B2 | 1/2011 | Jester | |
| 7,867,070 B2 * | 1/2011 | Day | 454/184 |
| 7,881,910 B2 | 2/2011 | Rasmussen et al. | |
| 2006/0007308 A1 | 1/2006 | Ide et al. | |
| 2006/0277206 A1 | 12/2006 | Bailey et al. | |
| 2009/0083586 A1 | 3/2009 | Warner et al. | |
| 2009/0138313 A1 | 5/2009 | Morgan et al. | |
| 2010/0268997 A1 | 10/2010 | Planki et al. | |

OTHER PUBLICATIONS

U.S. Appl. No. 12/378,429, filed Feb. 13, 2009.
U.S. Appl. No. 12/378,462, filed Feb. 13, 2009.
U.S. Appl. No. 12/378,414, filed Feb. 13, 2009.
International Search Report mailed Sep. 23, 2009 in PCT Application No. 2009/034093. (6 pages).
Written Opinion of the International Searching Authority mailed Sep. 23, 2009 in PCT Application No. 2009/034093. (10 pages).
Office Action dated Apr. 13, 2011 for U.S. Appl. No. 12/378,462, filed Feb. 13, 2009.
Office Action dated Nov. 3, 2011 for U.S. Appl. No. 12/378,462, filed Feb. 13, 2009.
Office Action dated Oct. 7, 2011 for U.S. Appl. No. 12/378,429, filed Feb. 13, 2009.
Office Action dated Nov. 16, 2010 for U.S. Appl. No. 12/378,414, filed Feb. 13, 2009.
Notice of Allowance dated Apr. 14, 2011 for U.S. Appl. No. 12/378,414, filed Feb. 13, 2009.
Notice of Allowance dated Jul. 28, 2011 for U.S. Appl. No. 12/378,414, filed Feb. 13, 2009.
Notice of Allowance dated Nov. 3, 2011 for U.S. Appl. No. 12/378,414, filed Feb. 13, 2009.

* cited by examiner

SYSTEMS AND METHODS FOR COMPUTER EQUIPMENT MANAGEMENT

PRIORITY CLAIM

This application claims the benefit of U.S. Provisional Patent Application Ser. No. 61/065,935 filed on Feb. 15, 2008, which is incorporated herein by reference in its entirety.

BACKGROUND

The present disclosure relates to systems and methods for managing computer equipment.

FIGURES

This patent or application file contains at least one drawing executed in color. Copies of this patent or patent application publication with color drawings will be provided by the Office upon request and payment of the necessary fee.

Embodiments of the present invention are described herein, by way of example, in conjunction with the following figures, wherein:

FIGS. 5b and 5c illustrate the interface of FIG. 5a at animation points subsequent to the view shown in FIG. 5a;

DESCRIPTION

Various embodiments are directed to systems and methods for managing computer equipment. Computer equipment may include any type of equipment used by a computer or computer system including, for example, processing components such as servers, and networking components such as switches, routers, etc., power components and even cooling units. The computer equipment may be housed in one or more dedicated server rooms or other similar facilities, where some equipment may be positioned on racks or in cabinets.

Figure 1:
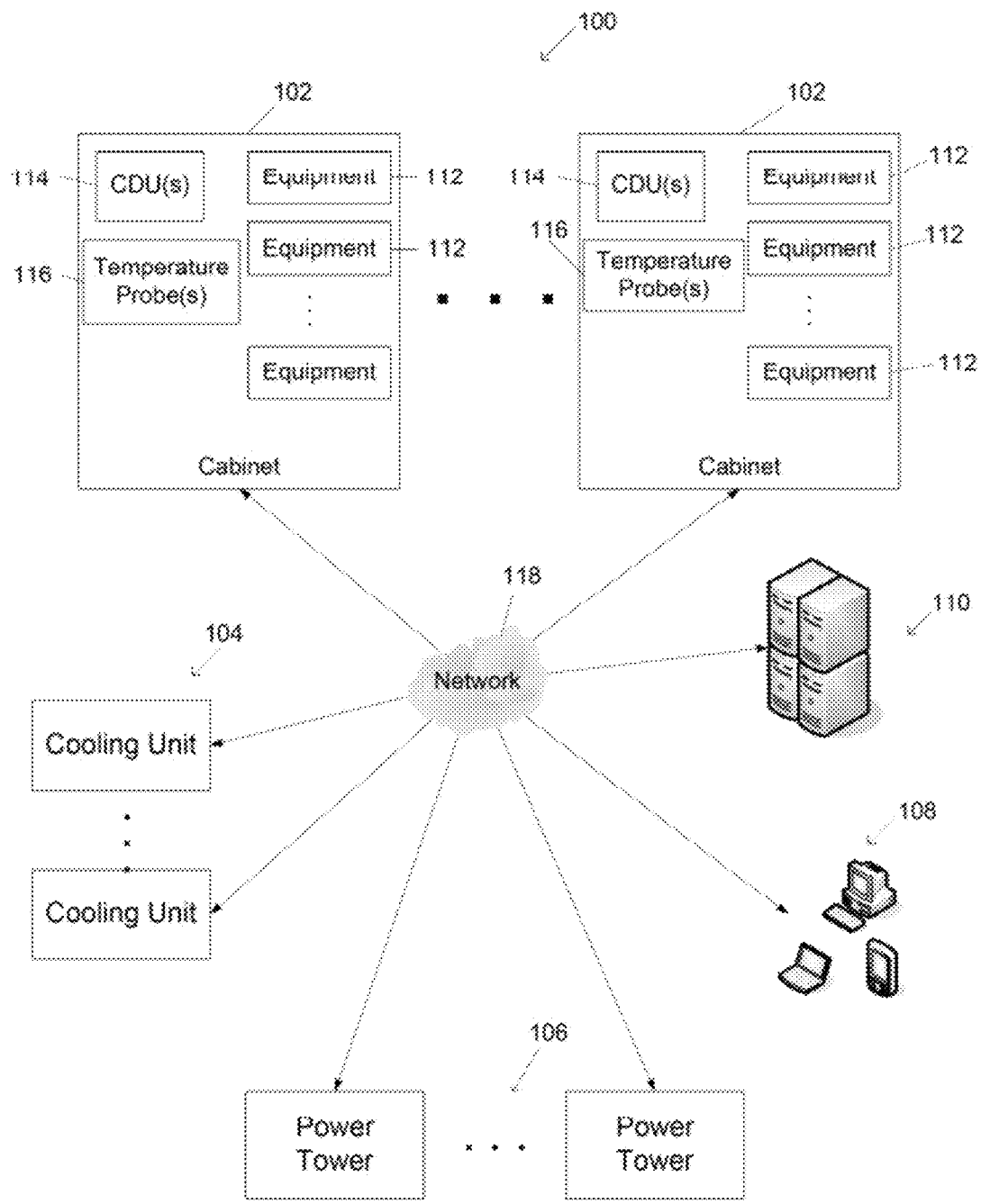
FIG. 1 illustrates one embodiment of a computer equipment management system.

FIG. 1 illustrates one embodiment of a computer equipment management system 100. The system 100 may comprise computer equipment 112 as well as various other components for supporting the equipment 112 and implementing management functions. It will be appreciated that all of the components of the system 100 may be generally referred to as computer equipment. According to various embodiments, computer equipment 112 may be housed in a plurality of cabinets 102 positioned within one or more server rooms. In addition to computer equipment 112, each cabinet 102 may comprise one or more Cabinet Distribution Units (CDU's) 114 for managing power provided to the computer equipment 112 and one or more temperature probes 116. For example, each cabinet 102 may include a first temperature probe 116 near its top and a second temperature probe 116 near its bottom. Also, for example, each cabinet 102 may have at least one temperature probe on its inlet side and at least one temperature probe on its outlet side relative to the direction of cooling fans. In some embodiments, additional temperature probes (not shown) may be positioned outside of the cabinets 102 to measure ambient temperature conditions. According to various embodiments, the CDU's 114, probes 116 and equipment 112 may be configured to communicate with other components of the system 100 over the network 118.

One or more cooling units 104 may be present in each server room and may be utilized to dissipate heat generated by the computer equipment 112, keeping the server room or rooms cool. Cooling units 104 may include one or more Computer Room Air Conditioners (CRAC's). Some cooling units 104 may be configured to provide operational data and/or receive configuration data over the network 118. Various power components 106 configured to manage power delivered to the various cabinets 102, may be positioned inside or outside of the server room or rooms. For example, power components 106 may include circuit breakers, power distribution units (PDU's), cabinet distribution units (CDU's), manual transfer switches (MTS's), static transfer switches (STS's), and/or other power conditioning equipment. Some power components 108 may also be configured to provide operational data and/or receive configuration data over the network 118. Power components 106 may be housed at any suitable locations including, within cabinets (e.g., CDU's 114), in walls, in stand-alone towers, etc.

User machines 108 may be utilized by various users to provide input regarding the management of the computer equipment 112 and also to receive results of various management functions. User machines 108 may include any suitable type of input/output device including, for example, desktop computers, laptop computers, palm computers, cellular phones, etc. The network 118 may be any suitable wired, wireless or mixed network. For example, the network 118 may comprise one or more local area networks (LAN's), one or more wide area networks (WAN's) or combinations thereof.

The system 100 may comprise a server 110 for implementing management functions, for example, as described herein below. The server 110 may include one or more devices having processing capacity (e.g., at least one processor or equivalent hardware). Devices making up the server 110 (e.g., computer equipment) may, but need not be stored at a common location. For example, devices making up the server 110 may be located in the server room or rooms. The server 110 may also communicate over the network 118. For example, the server 110 may receive operational data from various components such as, CDU's 114, temperature probes 116, cooling units 104, power components 108 and other management systems (not shown). Also, in some embodiments, the server 110 may provide configuration data to various system components, allowing the server 110 to control the operation of these components.

Figure 2:
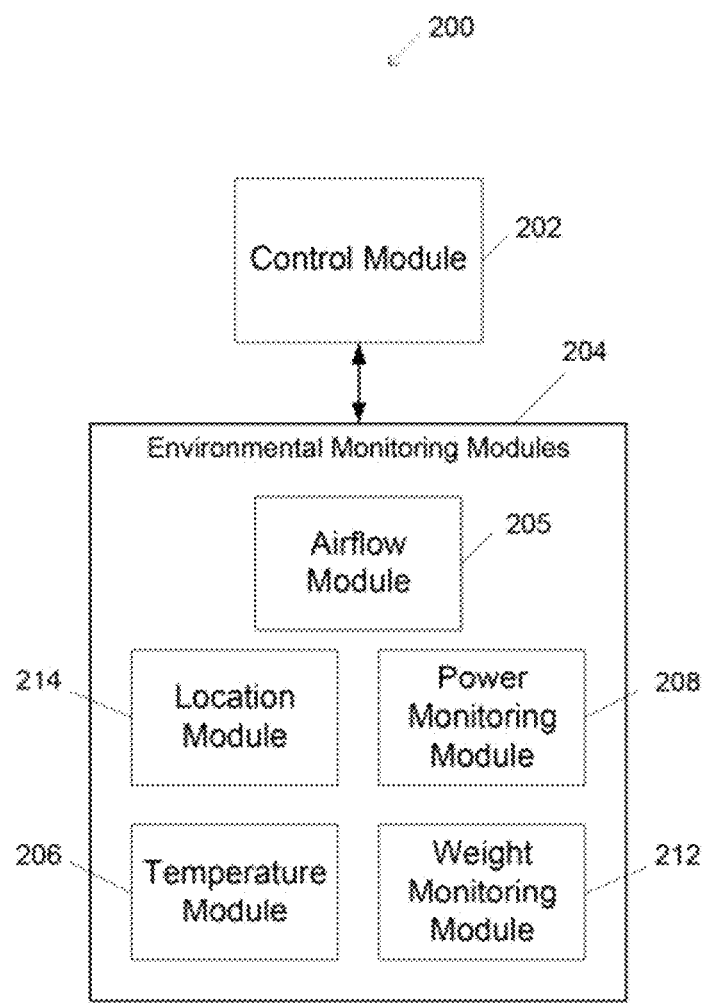
FIG. 2 illustrates one embodiment of a management function that may be implemented by the system of FIG. 1.

The server 110 may implement various management functions for managing the computer equipment 112. For example, FIG. 2 illustrates one embodiment of a management module 200 that may be implemented by the server 110 to manage computer equipment 112. The management module 200 may comprise various functional sub-modules including, for example, a control module 202 and various environmental monitoring modules 204. The environmental monitoring modules 204 may monitor environmental conditions in the server room or rooms. These conditions may be monitored directly (e.g., utilizing sensors such as temperature probes 116) or may be derived from other factors, as described herein below. Depending on the application, results of environmental monitoring may be provided to the control module 202 in real-time, or may be cataloged for future use. Not every implementation of the system 100 and the module 200 will include all of the environmental monitoring modules 204 shown. Some may have different combinations of modules 204 and may include additional modules (not shown) as well.

Figure 3:
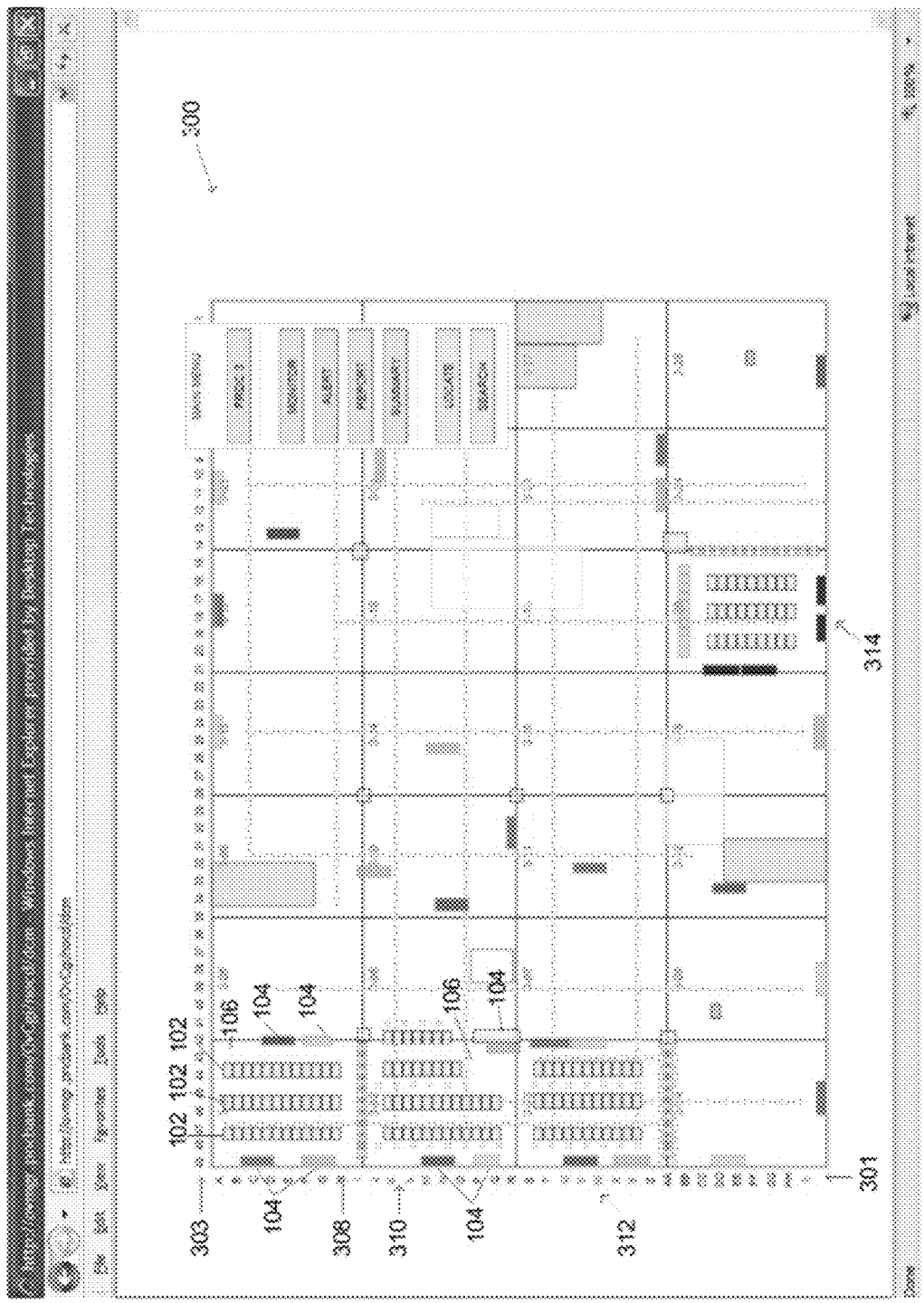
FIG. 3 illustrates a diagram of one embodiment of a server room floor showing an example method of classifying components by floor position.

A location module 214 may monitor the physical location of each component of the system 100. For example, the location of a given component may be recorded by building, room, and floor position. It will be appreciated that the location module 214 may describe the floor position of system components in any suitable way. For example, any suitable classification or coordinate system may be used. FIG. 3 illustrates a diagram of one embodiment of a server room floor 300 showing an example method of classifying components by floor position. The server room floor 300 is divided into a coordinate system, and each cabinet 102, power components 106, cooling unit 104, etc. is classified by a set of coordinates. As shown in FIG. 3, the coordinate system is described by numeric values on a horizontal axis 303 and alphabetical values on a vertical axis 301. According to various embodiments, the floor 300 may be further sub-divided into a series of zones, with each zone comprising a set of coordinate values. For example, zone 308 comprises three rows of cabinets 102, four cooling units 104 and power components 106. Other example zones, 310, 312, 314 are shown, and it will be appreciated that still other zones may be included, depending on the size and configuration of the floor 300.

Figure 4:
FIG. 4 illustrates a representation of one embodiment of an example cabinet for housing computer equipment.

According to various embodiments, the physical location of various computer equipment 112 may be further specified, for example, by cabinet position. FIG. 4 illustrates a representation of one embodiment of an example cabinet 400 for housing computer equipment. The vertical position of computer equipment within the cabinet 400 may be expressed in Rack Mount Units (RMU's). For example, the cabinet 400 comprises 42 RMU's, which are numbered 1-42. Each piece of computer equipment may be assigned to one or more RMU's. For example, computer equipment ZPPNTD071-D071 is positioned at RMU 15-18. Some pieces of computer equipment take up the full-width of the cabinet 400. Computer equipment that does not take up the full width of the cabinet 400 (e.g., switches, network ports, blade servers, etc.) may be also classified by horizontal position.

The location module 214 may track the location of system components, for example, by receiving an initial characterization of a system component location and subsequent indications of changes in the location of the system component. For example, when a system component is initially placed, its location may be recorded. When a system component is moved, this may also be recorded. In some embodiments, as described below, the location of any given system component will be determined by the control module 202. According to various embodiments sensors may be used to determine the physical location of various components (radio frequency identification (RFID) sensors, etc.). The measured location may then be sent to the location module 214.

Referring back to FIG. 2, a temperature module 206 may monitor the temperature at various locations within a server room as well as, for example, the status of various cooling units 104. For example, the temperature module 206 may receive and record readings from the temperature probes 116. An airflow module 205 may monitor the airflow and related characteristics. A power monitoring module 208 may monitor power-related signals from system 100 equipment. For example, the current drawn on all three phases of a CDU 114 or other power components 106 may be monitored. A weight monitoring module 212 may also be included. The weight monitoring module 212 may derive or be pre-programmed with the location of structural components (e.g., floor beams) as well as the locations of various computer equipment. The weight monitoring module 212 may compute, or assist the control module 202 in computing, an assessment of the best location for a new piece of computer equipment, for example, based on the location of existing equipment and the location of structural features such as floor beams.

The control module 202 may utilize the environmental readings provided by the environmental monitoring modules 204 to perform various management functions for the computer equipment 112. For example, the control module 202 may determine the physical placement of computer equipment 112 within a server room and/or within a given cabinet 102, as described herein. Also, the control module 202 may detect failures or other anomalies of the computer equipment 112 and/or various support equipment (e.g., CDU's 114, temperature probes 116, cooling units 104, power components 106, etc.), as described herein. Once a failure or anomaly is detected, the control module 202 may take action to correct the problem, or provide support information to a technician, who may then fix the problem. In addition, the control module 202 may provide and/or set values for controllable factors to achieve desired environmental conditions. For example, as described herein, air flow characteristics may be manipulated to achieve a desired cooling profile.

Figure 5A:
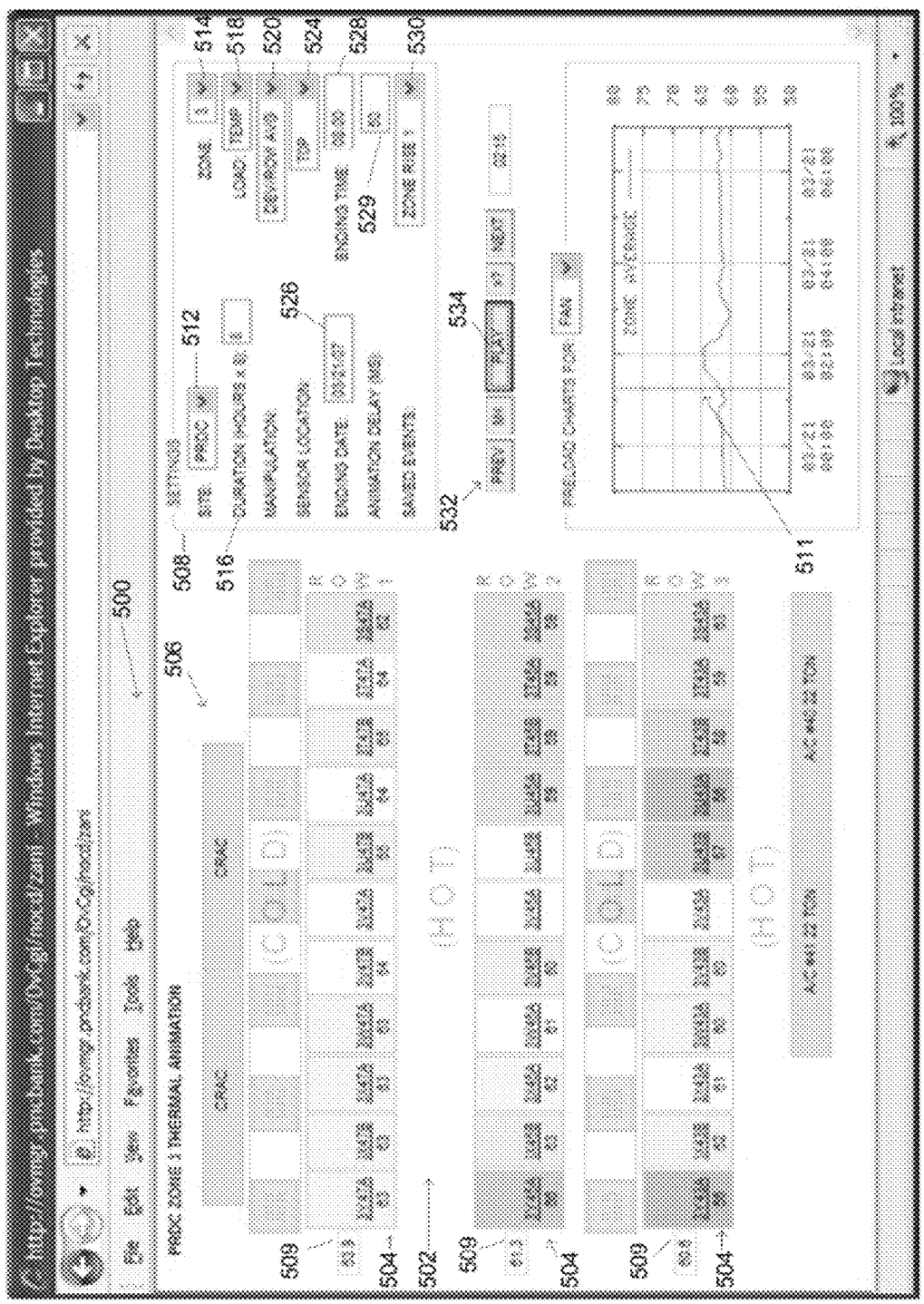
FIG. 5a illustrates one embodiment of a user interface for presenting temperature data to a user.

According to various embodiments, the control module 202 may include functionality for providing a user interface including graphical representations of environmental conditions. FIG. 5a illustrates one embodiment of a user interface 500 for presenting temperature data to a user. Temperature data may be received from and/or aggregated by the temperature module 208.

The interface 500 comprises a field 502 showing a graphical representation of all or a portion of a server room. For example, the field 502 may illustrate a zone of a server room comprising three rows 504 of cabinets along with cooling units 506. Each of the cabinets shown at the field 502 may be colored to indicate its temperature. Although the temperature of cabinets is indicated, it will be appreciated that any other computer equipment location may be described. Any suitable color scheme or scale may be used. In the embodiment shown, cool to hot temperatures are indicated on a continuum from dark blue to dark red, with white indicating temperatures between blue and red. Also, any other suitable visual scale may be used. For example, different shapes or blink rates may be used to indicate different temperatures.

The field 502 may also show a numerical indication of temperature 508 on each cabinet. The temperatures displayed at the field 502 (e.g., the numerical temperatures and/or the temperatures indicated by color) may be absolute temperatures or relative temperatures. For example, the temperature for each cabinet may be normalized by comparison to other cabinets in the same row, or other cabinets in the displayed zone. The interface 500 may also include a chart field 510 showing temperature over time. For example, as shown in FIG. 5a, the chart field 510 illustrates the zone average temperature over an eight hour period. A time line 511 may indicate which portion of the graph is illustrated at field 502.

Figure 5B:
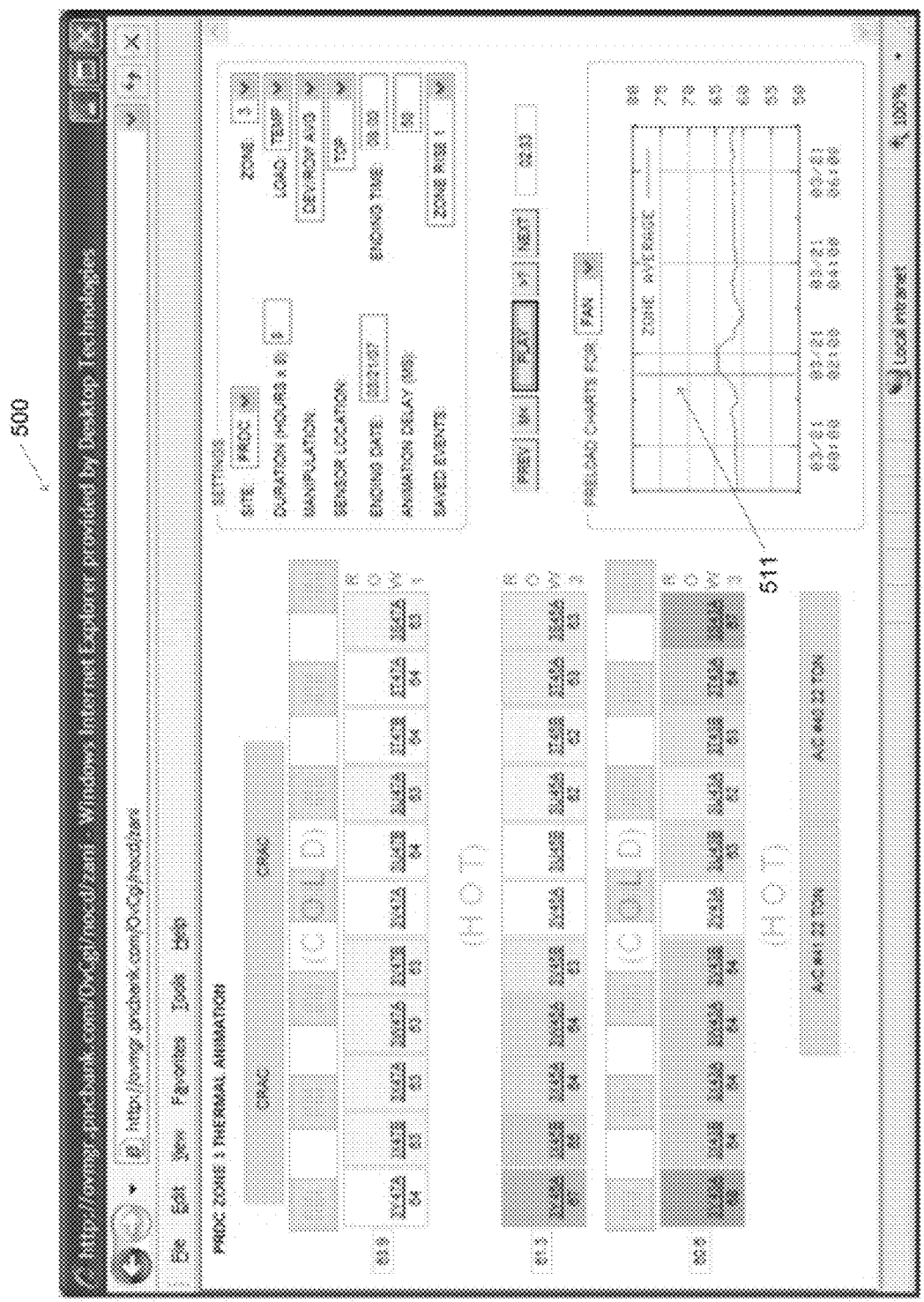
Figure 5C:
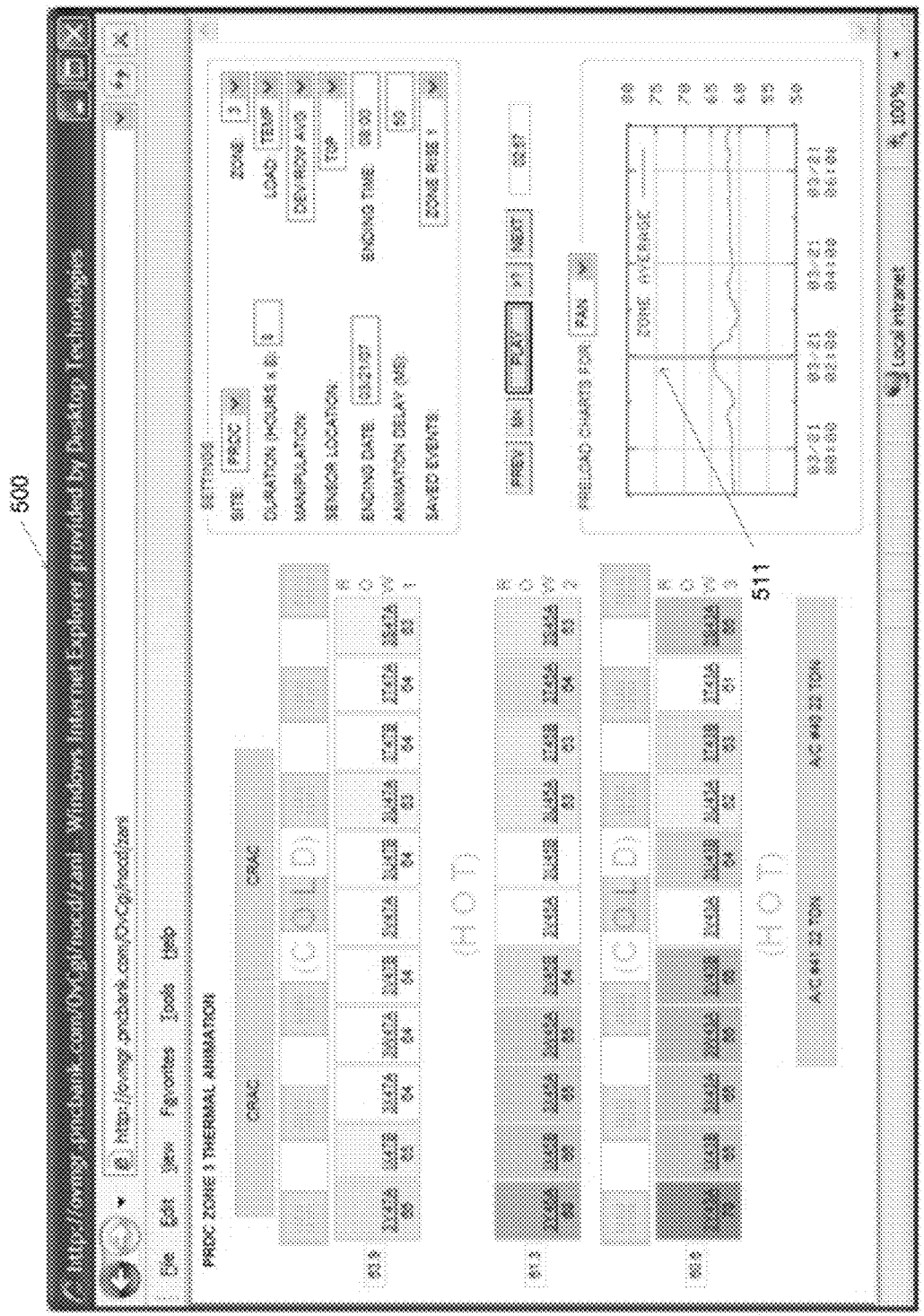

According to various embodiments, the interface 500 may be configured to display an animation of temperature data over time. The environmental monitoring modules 204 may receive a chronological series of data from each cabinet 102 or other computer equipment location. The interface 500 may be animated by chronologically displaying data from each of the cabinets 102. For example, FIGS. 5a, 5b and 5c illustrate shots in an animation sequence. The number of shots in any given animation may depend on the sampling rate (e.g., frequency of the series) and the desired length of the sequence in real time. The user may navigate through the animation, for example, utilizing buttons 532. Selecting button 534 may cause the animation to begin.

The interface 500 may include additional inputs allowing a user to customize an animation. The Settings field 508 may allow the user to enter additional parameters that may relate to the static display of the interface 500 as well as to a desired animation. For example, the user may select the a site and zone to be displayed at inputs 512 and 514. The desired duration of an animation in real time may be entered at input 516. The desired environmental factor (e.g., temperature, current draw, etc.) may be entered at input 518. Manipulating input 520 may allow the user to specify how temperature or other data is to be presented. For example, as illustrated, the temperature (e.g., color) of each cabinet is illustrated based on its deviation from the average temperature of other cabinets in the same row 504. Sensor location input 524 may allow the user to determine which sensors, or combinations of sensors, will have their output displayed. For example, as shown in FIG. 5, the sensors at the top of the various cabinets have been selected. In other embodiments, sensors located at other various places could be selected, as well as combinations of the outputs of multiple sensor locations. Inputs 526 and 528 allow the user to specify an ending date and time for the animation. Input 550 may allow a user to recall a saved animation event. An animation delay field 529 may allow the user to select a desired delay between frames in the animation.

Figure 6A:
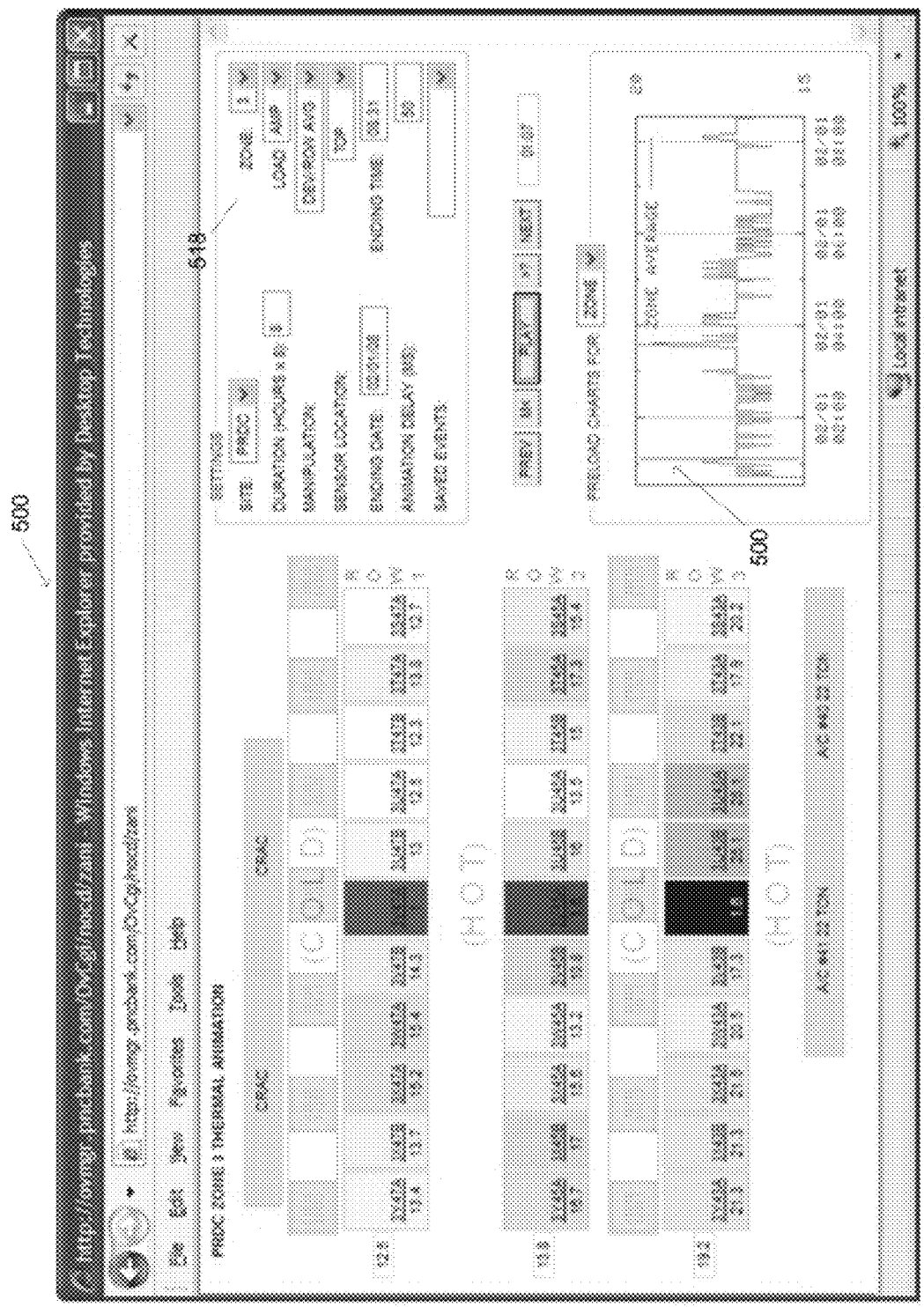
FIGS. 6a, 6b and 6c illustrate the interface of FIG. 5a configured to display current.
Figure 6B:
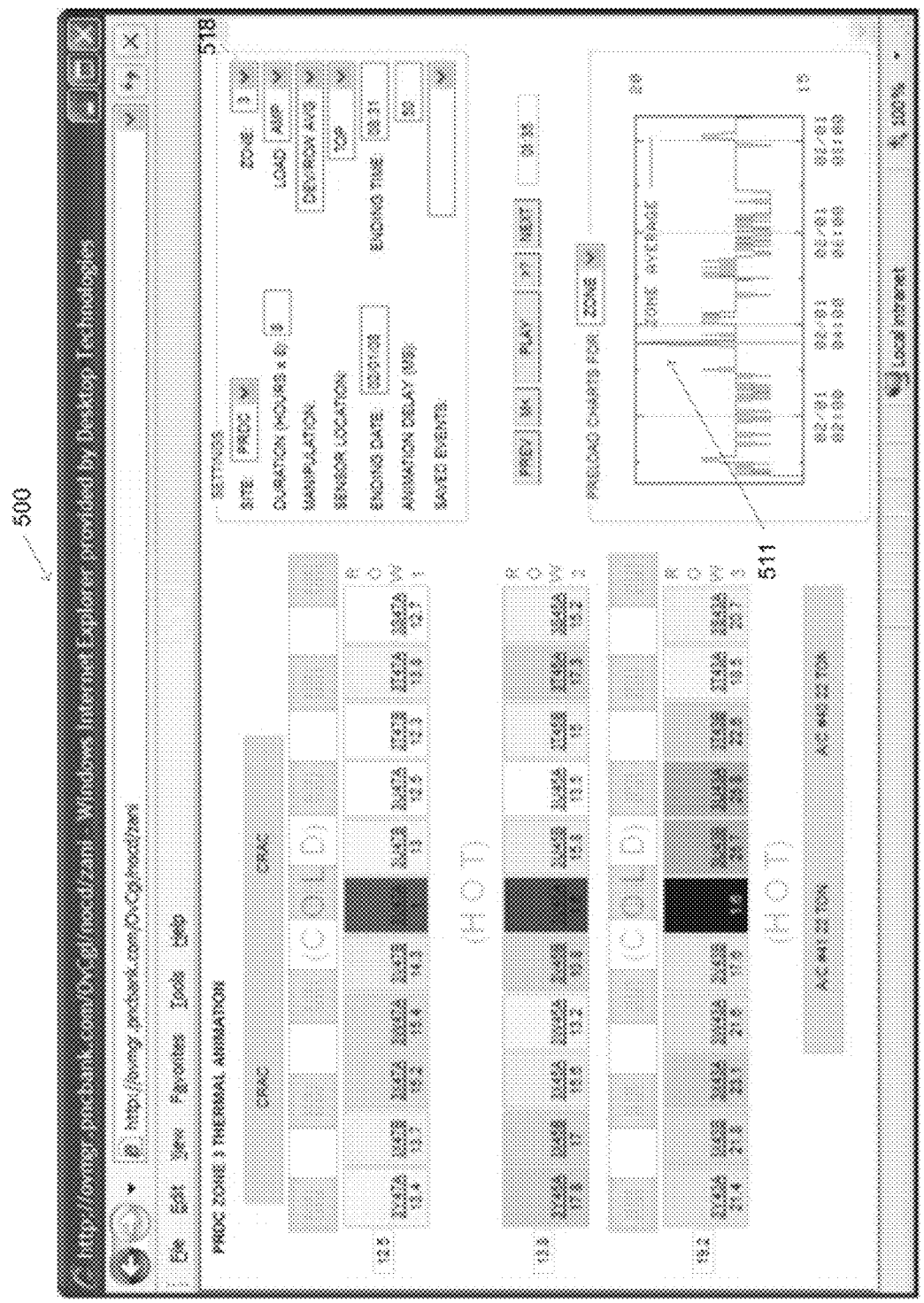
Figure 6C:
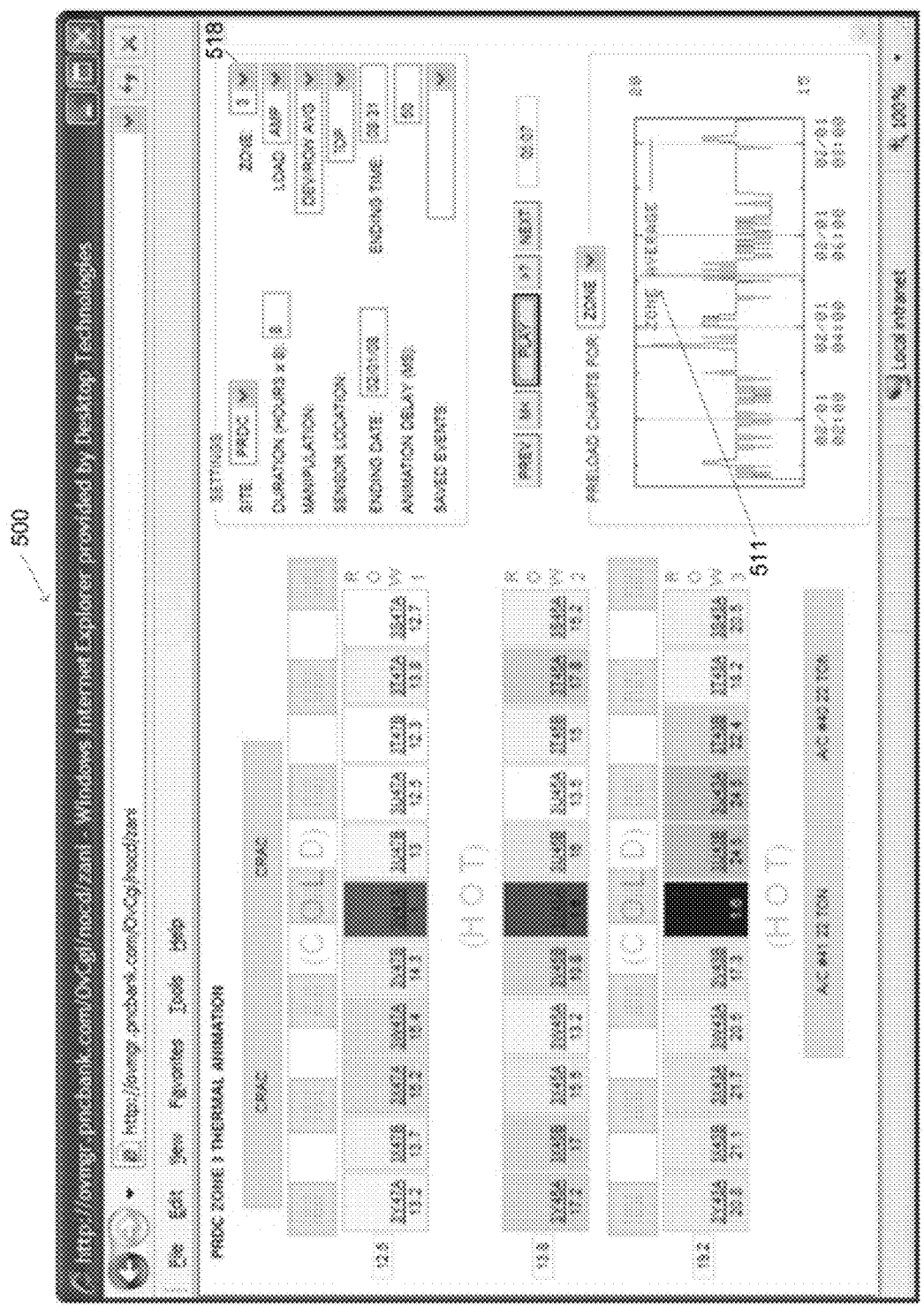

FIGS. 6a, 6b and 6c illustrate the interface 500 configured to display current drawn by the cabinets. Current data may be collected and/or aggregated by the power monitoring module 208. The color of each cabinet may indicate an amount of current drawn, again with a continuum of dark blue to white to dark red indicating increasing current. Current draw may also be animated in a manner similar to that described above. For example, FIGS. 6a, 6b and 6c illustrate sequential shots during an animation.

Figure 7A:
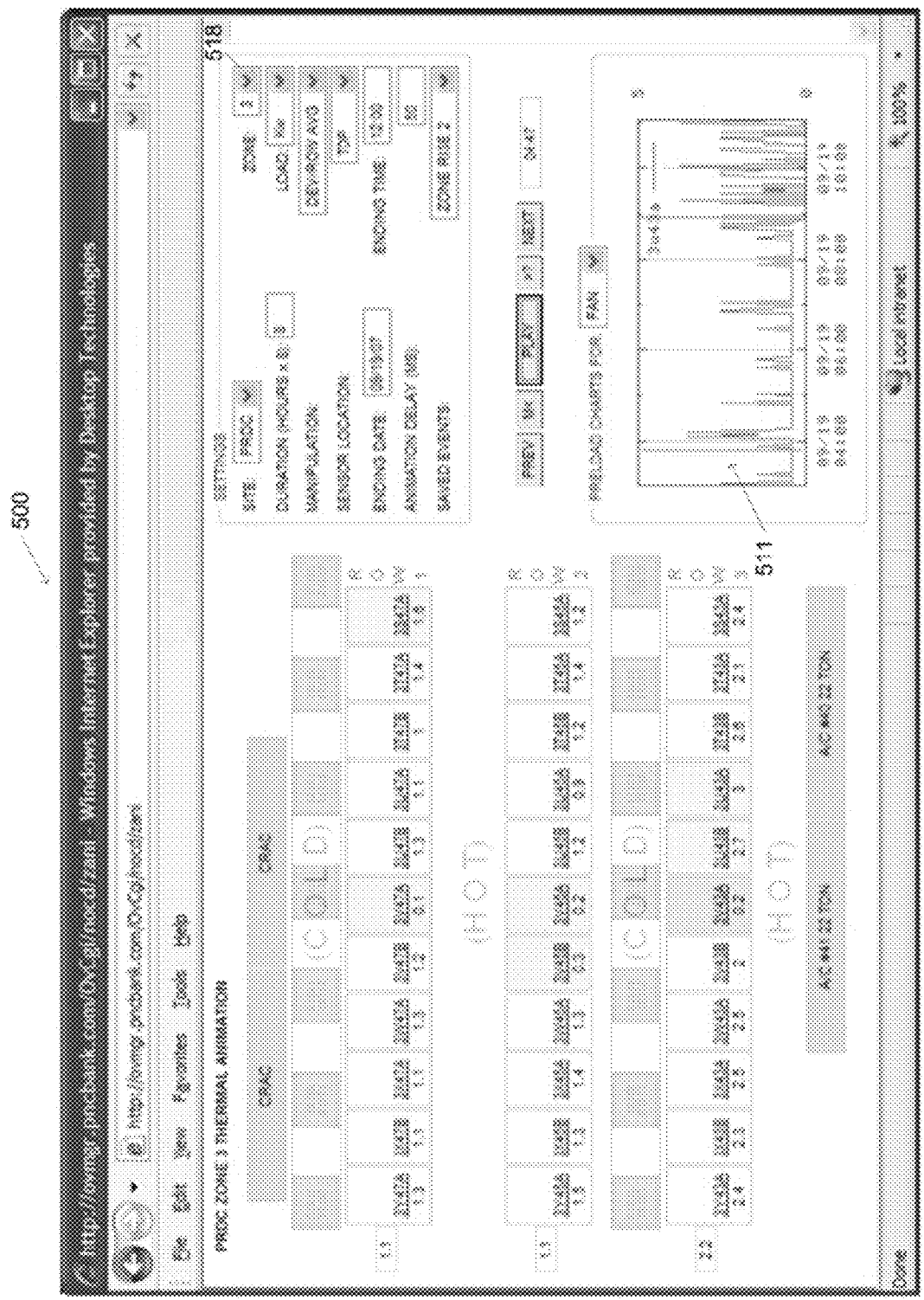
FIGS. 7a, 7b and 7c illustrate the interface of FIG. 5a configured to display power consumption.
Figure 7B:
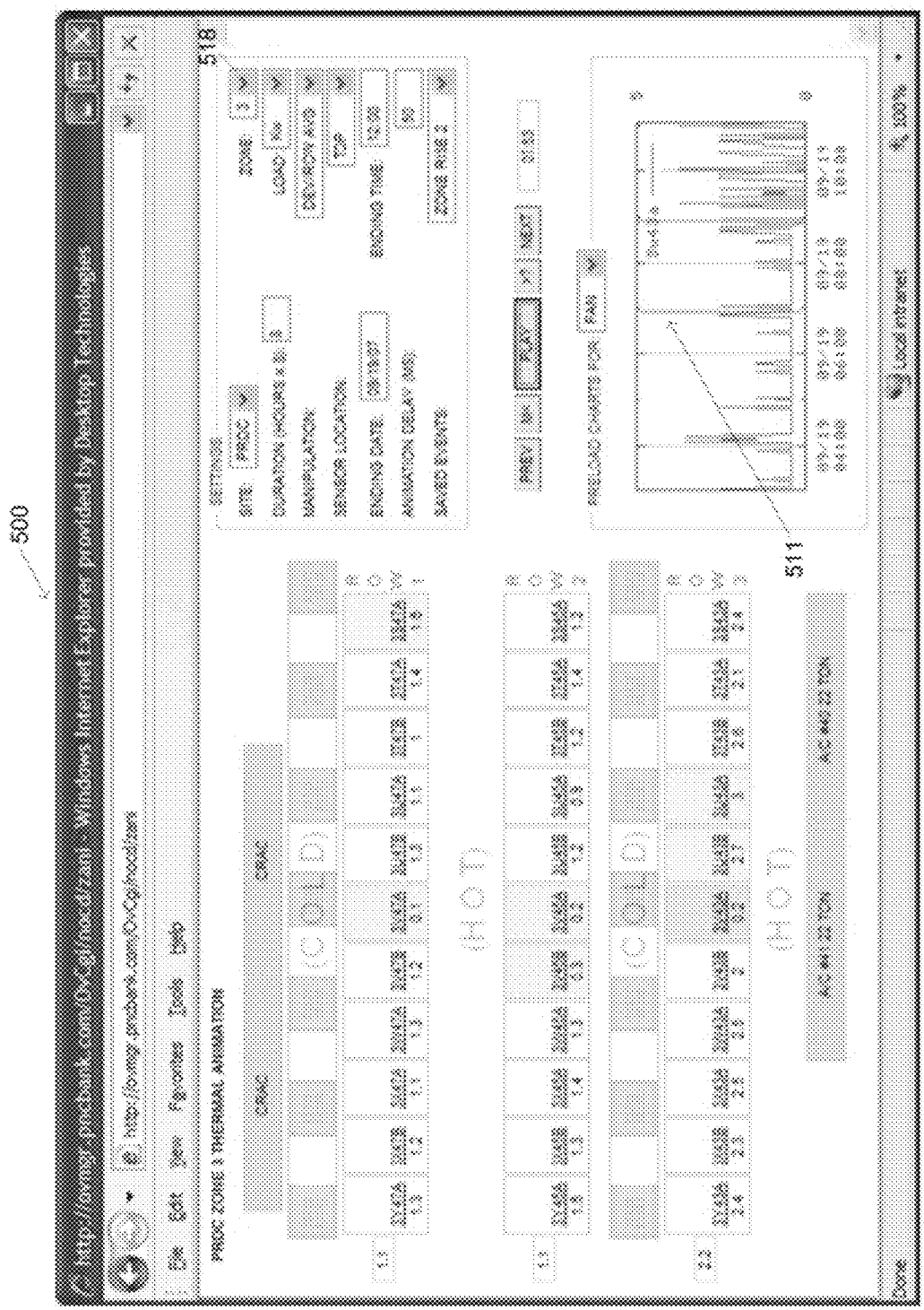
Figure 7C:
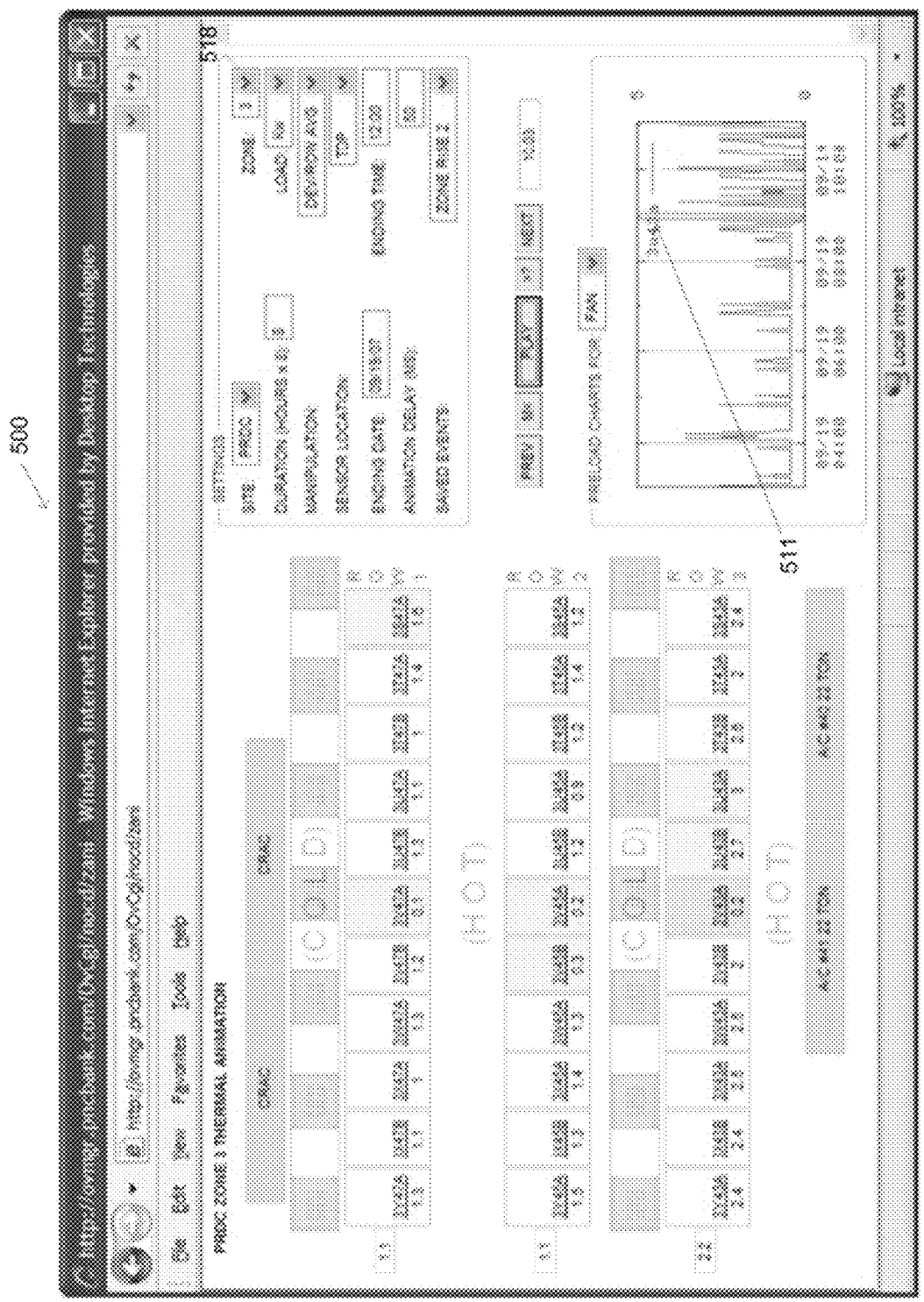

FIGS. 7a, 7b and 7c illustrate the interface of 500 configured to display power consumption. Power consumption data may be collected and/or aggregated by the power monitoring module 208. For example, power consumption data may be derived from current data and the voltage level of various components, which may be assumed constant. As with temperature and current data, power consumption data may be animated as described above. FIGS. 7a, 7b and 7c illustrate sequential shots during an animation. It will be appreciated that animations for additional environmental parameters may be generated in a similar manner.

Animation of computer equipment data, as illustrated in FIGS. 5a-c, 6a-c, and 7a-c has produced several unpredicted and unexpected results. For example, upon implementing the animation of temperature data, as shown in FIGS. 5a-c, the inventors discovered a potentially harmful problem with their cooling units. Viewing an animation of cabinet temperature by zone, as shown by the interface 500 the inventors discovered that the average zone temperature was periodically rising by as many as 4° F. per hour. Individual cabinet temperatures were rising by 10-12° F. during the same time period. The zone and individual cabinet temperatures would then drop back to standard levels. Because these events took place over a limited amount of time, they were not captured by existing, manual methods for temperature monitoring. The animation prompted the inventors to investigate the operation of their cooling units and discover that all of the cooling units were cycling off at the same time. While all of the cooling units were cycled off, the temperature in the zone rose quickly until the cooling units came back on-line. Upon modifying the cycling properties of the cooling units, this anomaly disappeared.

In another example, an animation of cabinet temperature by zone revealed a single cabinet with a temperature significantly higher than its neighbors. The inventors inspected the cabinet and found that a piece of computer equipment had been installed backwards, causing all of the other equipment in the cabinet to heat up. In yet another example, viewing an animation allowed the inventors to notice that a single cabinet had increased in temperature relative to its neighbors by 15° F. Upon inspection of the cabinet, the inventors realized that temperature probes in the cabinet had been misplaced. In still another example, viewing a temperature animation allowed the inventors to detect the failure of a cooling unit due to a coolant interruption.

Figure 8:
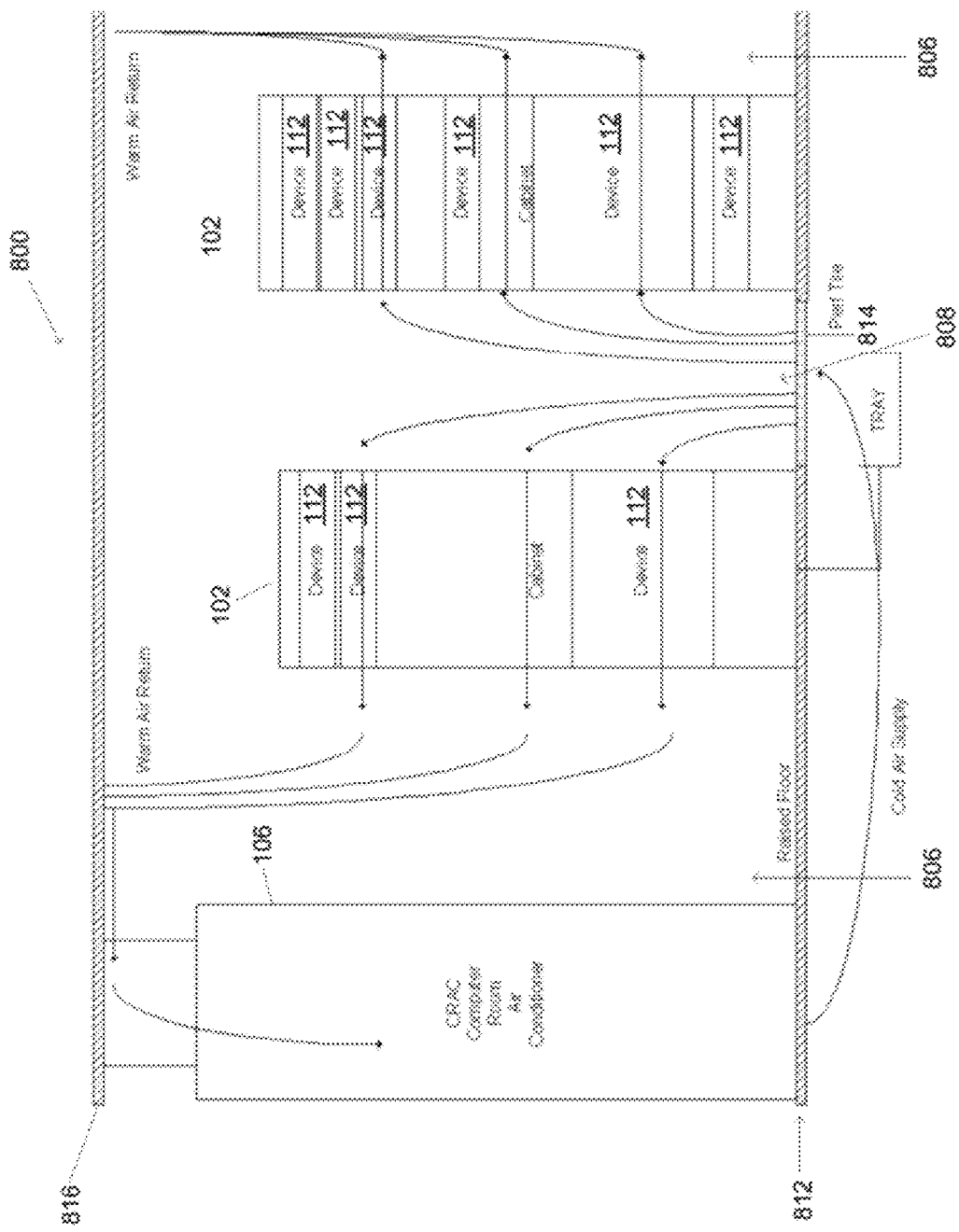
FIG. 8 illustrates a cross-sectional diagram of one embodiment of a cooling configuration in an example server room.
Figure 9:
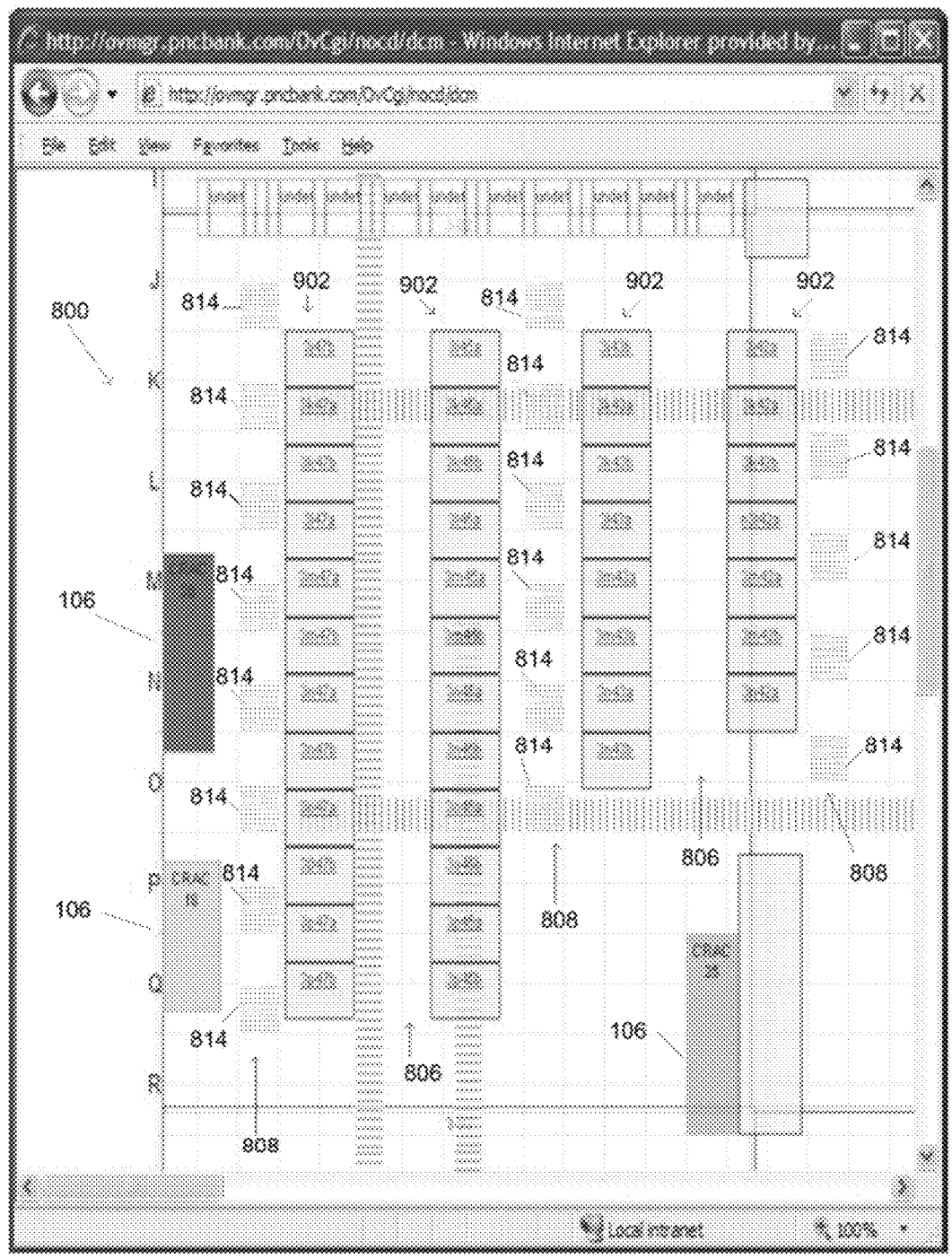
FIG. 9 illustrates a top view diagram of one embodiment of the server room of FIG. 8.

According to various embodiments, the control module 202 may also include functionality for modeling and manipulating the environmental profile of a server room. Before discussing this functionality in detail, a description of an example server room cooling configuration is provided. FIG. 8 illustrates a cross-sectional diagram of one embodiment of a cooling configuration in an example server room 800. The diagram shows two cabinets 102 and a cooling unit 104, which may be a computer room air conditioner or (CRAC). The cabinets 102 may house computer equipment 112 as shown. Aisles 806, 808 between the cabinets may be classified as cold aisles 808 and hot aisles 806. FIG. 9 illustrates a top view diagram of one embodiment of the server room 800. Four rows 902 of cabinets 102 are shown separated by cold aisles 808 and hot aisles 806.

To cool the server room 800, the cooling unit 104 may generate cold air, which is blown under the floor 812. As a result, static pressure under the floor 812 causes the cold air to flow up through perforated tiles 814 positioned in the floor 812 under the cold aisles 808. The cold air may be pulled through the cabinets 102 and devices 112, for example, by cooling fans located in the cabinets 102 and/or the devices 112. As the cold air is pulled through the devices 112, it cools the devices and, as a result, heats up. The now hot air emerges on the opposite side of the cabinets 112 into a hot aisle 806. The hot air either rises or is pulled by fans into a hot air return vents in the ceiling over the hot aisles 806. The hot air return vents channel the hot air back to the cooling unit 104, where the cycle begins again.

According to various embodiments, the control module 202 may be programmed with functionality for managing the airflow characteristics of the server room 800. For example, the airflow module 205 may monitor and/or estimate various airflow/cooling related factors including, for example, the number, type and placement of perforated tiles 814, the static pressure generated below the floor 814, and the difference in temperature between hot aisles 806 and cold aisles 808 (delta T). In various embodiments, the number, type and placement of perforated tiles 814 may be entered by a user, or may be monitored based on previous placement recommendations. The static pressure generated below the floor 814 may be actively monitored by sensors in communication with the management module 200, or may be received from a user based on periodic manual measurements. It will be appreciated that the static pressure may not be constant under the entire floor 814, but may vary based on, for example, distance from the cooling units 104, obstructions under the floor 814, etc. The delta T may be actively monitored by temperature probes in communication with the management module 200, may be received from a user based on periodic manual measurements, or may be derived based on other variables.

The control module 202 may manipulate and/or recommend changes to the airflow characteristics of the server room 800 in order to achieve adequate cooling and/or peak efficiency. For example, the airflow characteristics may be generally described by Equation (1) below:

$$\text{airflow} \sim \frac{\text{power}}{deltaT} \quad (1)$$

Airflow may be derived from the static pressure under the floor 812 as well as the number and type of perforated tiles 814. Power may be the power dissipated by the equipment 112 present in the server room 800, as measured by the power module 208 (e.g., by monitoring current draw). Delta T may be a function of various factors including, the cooling characteristics of equipment actually present in the server room 800. According to various embodiments, delta T may be multiplied by a constant c, which may be equal to 0.317. It will be appreciated that airflow characteristics may be monitored and/or manipulated for the server room 800 as a whole, or for various sub-units thereof (e.g., zones, rows, cabinets.) If the airflow characteristics of a larger area are being monitored, then the various airflow characteristics may be aggregated according to any suitable method (e.g., average, etc.).

Figure 10:
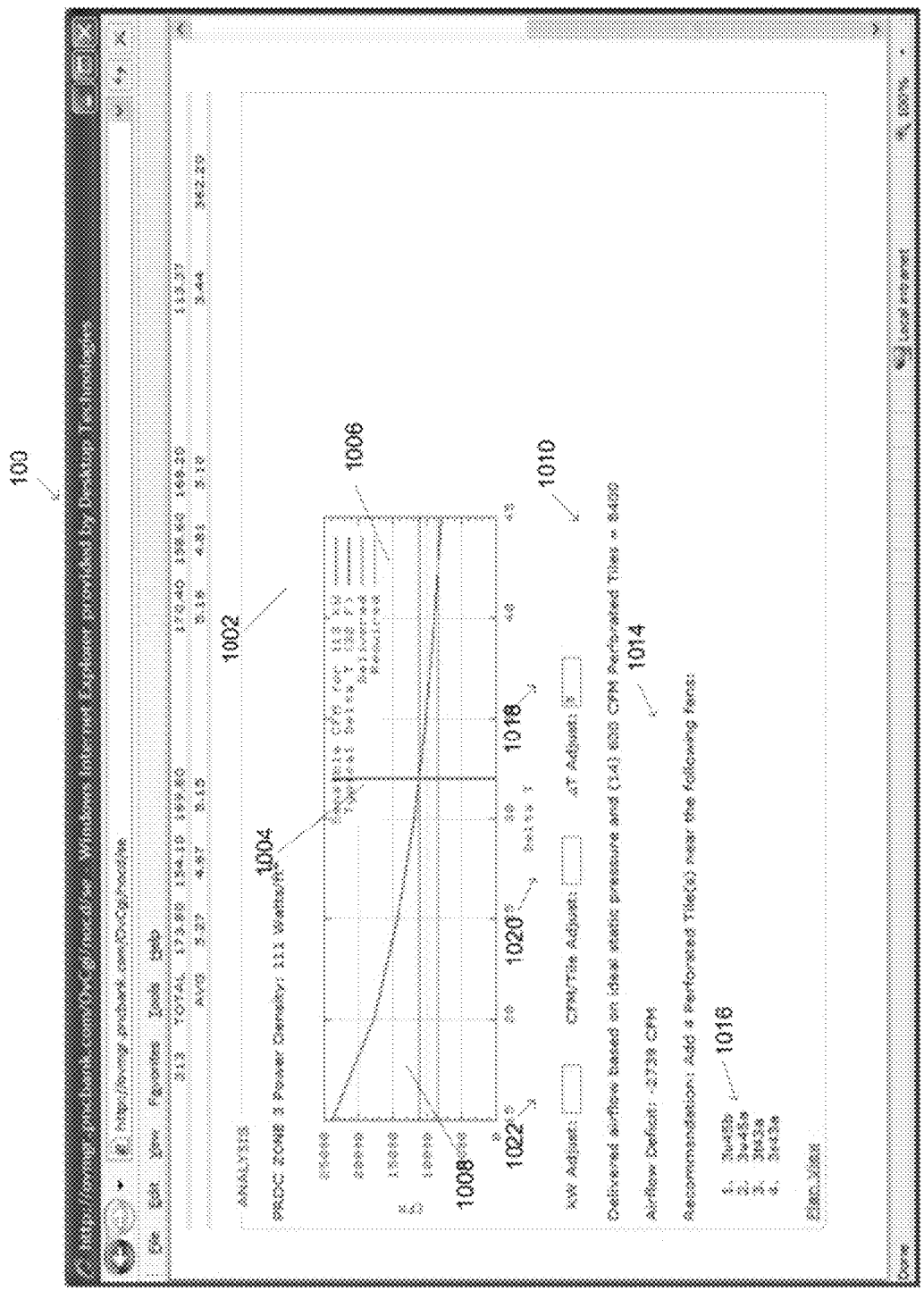
FIG. 10 illustrates one embodiment of a user interface for receiving and presenting the results of calculations involving temperature variables.

Utilizing the relationship between these airflow characteristics (e.g., Equation 1), the control module 202 may be programmed to calculate optimum values for each. The control module 202 may then either program the various equipment according to these values, or provide the values to a technician or other personnel who may implement them manually. FIG. 10 illustrates one embodiment of a user interface 1000 for receiving and presenting the results of calculations involving airflow characteristics. Field 1002 illustrates a curve showing delta T versus airflow in a zone of the server room 800 assuming a given power dissipation in the zone. As shown, airflow is expressed in units of cubic feet per minute (CFM). Vertical line 1004 indicates an expected delta T, which may be based on industry standards, set by the user or calculated by the control module 202 to optimize the values of other airflow characteristics. Horizontal line 1006 indicates the airflow necessary to bring about the expected delta T, given the zone power dissipation. Horizontal line 1008 indicates the airflow actually being delivered to the zone (e.g., the delivered airflow). A numerical value for actual airflow may also be provided, as shown at field 1010.

If the expected and actual values for airflow and/or delta T do not match, the control module 202 may calculate and display values for various controllable environmental factors to remedy the situation. For example, a difference between actual and target airflow may be indicated at field 1012. In the scenario illustrated by FIG. 10, this difference is a deficit, indicating that the actual airflow 1008 is low. Recommended actions for solving a deficit or surplus of airflow may be presented at fields 1014 and 1016. In the example shown, the recommended remedy includes adding four perforated tiles 814 to the server room 800 at the locations indicated at field 1016. For example, if the amount of airflow is to be increased, the recommended location for new perforated tiles may be close to the hottest cabinets of the zone. On the other hand, if the amount of airflow is to be decreased, the recommended locations for removing perforated tiles may be near cabinets that are relatively cool.

Various other actions may be recommended by the control module 202 to remedy a surplus or deficit of airflow. For example, the control module 202 may recommend that the cooling units 104 be manipulated to increase or reduce the static pressure under the floor 812, thus increasing or decreasing airflow. Also, for example, the cooling units 104 may recommend that certain equipment 112 be moved from the zone, thus reducing dissipated power.

According to various embodiments, the control module 202 may receive adjustments to some or all of the variables described above via the interface 1000. For example, at field 1018, a user may provide an adjusted expected delta T. At field 1020, the user may indicate a change in the airflow supported by each perforated tile. At field 1022, the user may indicate a change in the power dissipated by the relevant zone. These adjustments may be considered by the control module 202 in performing calculations, as described above.

According to various embodiments, the control module 202 may be configured to implement corrections automatically rather that merely making recommendations to a user. For example, some perforated tiles 814 may have adjustable openings that may be manipulated by a servo or other motor. The control module 202 may communicate with the various servos over the network 118 to individually manipulate the airflow at each perforated tile. Also, the control module 202 may be in communication with the various cooling units 104 or other cooling units 104, allowing the control module 202 to manipulate the static air pressure and/or air temperature.

According to various embodiments, the control module 202 may also include functionality for performing power failure analyses. For example, the control module 202 may derive the computer equipment 112 that would be affected by a failure of a given CDU 114 or power components 106. This may be accomplished in any suitable way. For example, the control module 202 may maintain a database setting forth the power connectivity of each piece of computer equipment 112. Modeling the failure of a CDU 114 or power components 106 may involve listing all of the equipment 112 that is connected directly or indirectly to the failed unit.

The criticality of any given dependence may also be found. For example, some CDU's 114 and/or power components 106 may be backed up with an Uninterruptible Power Supply (UPS), while other CDU's 114 and/or power components 106 may be backed up by a typical normal/emergency (N/E) feeder. (It will be appreciated that many pieces of computer equipment 112 may be dual corded, allowing them to derive power from more than one CDU 114 and even more than one set of power components 106.) In the event of a power failure, equipment 112 deriving power from a UPS CDU 114 or power components 106 may stay up while generator power is implemented. On the other hand, equipment 112 deriving power solely from an N/E CDU 114 or power components

106 may momentarily go down until generator power is implemented. Accordingly, the failure of a UPS CDU 114 or power components 106 may be considered more critical than the failure of an N/E CDU 114 or power components 106.

Figure 11:
FIG. 11 illustrates a user interface showing the server floor of FIG. 3 and illustrating the affected units resulting from a failure of an example power tower.

According to various embodiments, the control module 202 may be configured to present the results of a power failure analysis graphically. For example, referring back to FIG. 3, the diagram of the server floor 300 may be modified to illustrate only those cabinets 102 and other units that are affected by the failure of a power device 114, 106. For example, FIG. 11 illustrates a user interface showing the server floor 300 and illustrating the affected units 1102 resulting from a failure of example power components 106. According to various embodiments the criticality of the failure of a given affected unit 1102 may be indicated by its color or other visual indication. For example, affected units 1102 having one or more UPS CDU's 114 or other power sources still in operation may be least critical and may be assigned a first color or visual indication. Affected units 1102 having only N/E CDU's 114 or other power sources still available may be more critical and may be assigned a second color or visual indication. Affected units with no CDU's or power sources still available may be most critical and may be assigned a third color or visual indication. It will be appreciated that affected units 1102 may be found and indicated at the cabinet level, or at the individual equipment 112 level.

Figure 12:
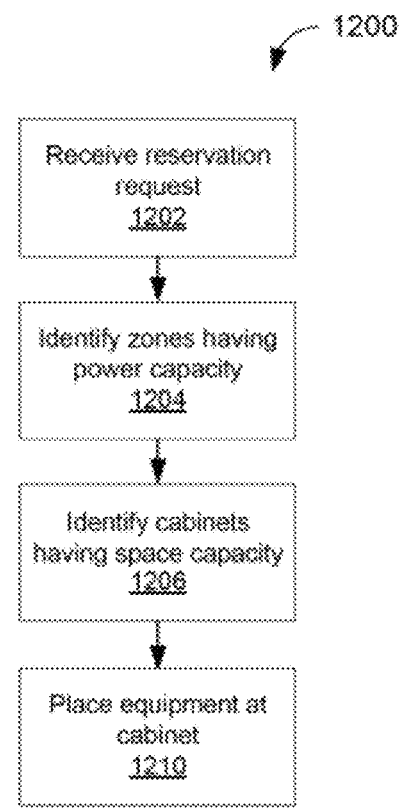
FIG. 12 illustrates one embodiment of a process flow for handling placing.

According to various embodiments, the control module 202 may also include functionality for placing equipment 112 on a server floor. FIG. 12 illustrates one embodiment of a process flow 1200 for placing equipment on a server floor, such as the server floor 300. At box 1202, the control module 202 may receive a reservation request. The reservation request may specify the type of equipment 112 to be placed. Additional information regarding the equipment 112 to be placed may be either included with the reservation request or derived from the equipment type. Examples of such additional information may include, the height of the equipment in RMU's, the width of the equipment, the power dissipation of the equipment, the weight of the equipment, whether the equipment is single or dual-corded, etc. Reservation requests may be entered manually and/or generated automatically in anticipation of future need.

At box 1204, the control module 202 may identify portions of the server floor that have sufficient power capacity to handle the equipment 112 to be placed. It will be appreciated that each zone 308, 310, 312, 314 or other sub-unit of the server floor 300 may be designed with a given power capacity. The power capacity of a zone may be determined based on various factors including, for example, the number and/or capacity of cooling units 104, the heat capacity of equipment 112, etc. Different zones may have different power capacities. In some embodiments, the control module 202 may be configured to leave a safety margin in each zone (e.g., twenty percent of the total capacity). For example, a zone with a power capacity of 150 kW/ft$^2$ may not be considered to have excess capacity unless it is dissipating fewer than 135 kW/ft$^2$.

The control module 202 may determine whether a zone has sufficient power capacity to accept the equipment 112 to be placed by comparing its present power dissipation with its capacity power dissipation as well as the power dissipation of the equipment 112. For example, if the sum of the present power dissipation and the power dissipation of the equipment 112 to be placed is less than the capacity, then the zone may have sufficient capacity to accept the equipment 112.

According to various embodiments, some zones may include equipment 112 with variable power requirements. For example, a server running multiple virtual machine-type instances may dissipate power at a rate proportional to its processing load. Examples of software packages that may cause a server to dissipate power based on its processing load include, for example, VMWARE and Oracle VM virtual machine software for INTEL compatible platforms, M-SERIES software for SUN SPARCSTATION platforms, etc. One example variable power server may dissipate between 500 kW and 1000 kW, depending on load. The control module 202 may be configured to consider equipment 112 with variable power requirements when calculating both the existing power dissipation of a zone and the power dissipation of the equipment 112 to be placed. According to various embodiments, variable power requirement equipment may be considered to always dissipate at its maximum dissipation, regardless of its present state. This may prevent zones from exceeding their power capacity as the power dissipation of variable equipment changes. According to other various embodiments, the historical power dissipation of variable dissipation equipment may be analyzed to determine an expected maximum dissipation for the equipment. The equipment may then be considered to dissipate at the expected maximum, again regardless of present state. Any other suitable method may be used to account for computer equipment with variable power requirements.

In addition to zone-level power capacity requirements, the control module 202 may also consider cabinet level requirements. For example, each cabinet 102 may have a maximum power capacity based, for example, on the power capacity of the zone and any other characteristics specific to the cabinet (e.g., cooling characteristics, CDU 114 limitations, etc.). For example, the maximum power capacity of a cabinet 102 may be set to the power capacity of its zone divided by the number of cabinets therein.

At box 1206, the control module 202 may identify cabinets 102 that have free physical space sufficient to house the equipment 112 to be placed. The cabinets identified at box 1206 may be within the zone or zones identified at box 1204. Each piece of equipment 112 to be placed may require a given number of contiguous RMU's for placement. For example, referring to FIG. 4, the cabinet 400 comprises free space between RMU's 25 and 28. Accordingly, it has free physical space sufficient to house computer equipment 112 up to four RMU's in height and no more than one cabinet width in width.

At box 1208, the control module 202 may assign the equipment 112 to be placed to an identified space in a cabinet 102, for example, based on the results of boxes 1204 and 1206. According to various embodiments, the control module 202 may also consider weight factors. For example, the control module 202 may have access to diagrams of the structural components of the floor 300, or an indication of the weight capacity of different portions of the floor 300. The control module 202 may also have access to the weight of various components placed on the floor 300 as well as the weight of the equipment 112 that is the subject of the reservation request. Accordingly, the control module 202 may perform an analysis to determine whether placement of the equipment 112 that is the subject of the reservation request would exceed the weight capacity of the floor 300 or any portion thereof.

According to various embodiments, the control module 202 may also include functionality for detecting and reporting anomalous events in the system 100. For example, the control module 202 may monitor operational parameters of the equipment 112, CDU's 114, cooling units 104, power components 106 and other components of the system 100. Anomalous events may include any kind of event that is out of the ordinary or may signal a problem. For example, the loss of power to a CDU 114 or other component may be an anomalous event. Also, for example, a failure of output from a cooling unit 104, piece of computer equipment 112, or other system component may be an anomalous event. Other anomalous events may be based on parameter thresholds. For example, a cabinet 102 or zone may trigger an anomalous event if its temperature and/or current draw exceeds a given threshold.

Upon detection of an anomalous event, the control unit 202 may prepare an alert ticket comprising an interface presenting information describing the event. The alert ticket may then be routed to appropriate personnel. For example, if the anomalous event is regarding a particular type of computer equipment, the alert ticket may be routed to a technician with responsibility for power components. Also, for example, if the anomalous event is related to a particular zone, floor, or other unit of a server facility, then the alert ticket may be routed to a technician with responsibility for the zone, floor or other server facility unit.

Figure 13:
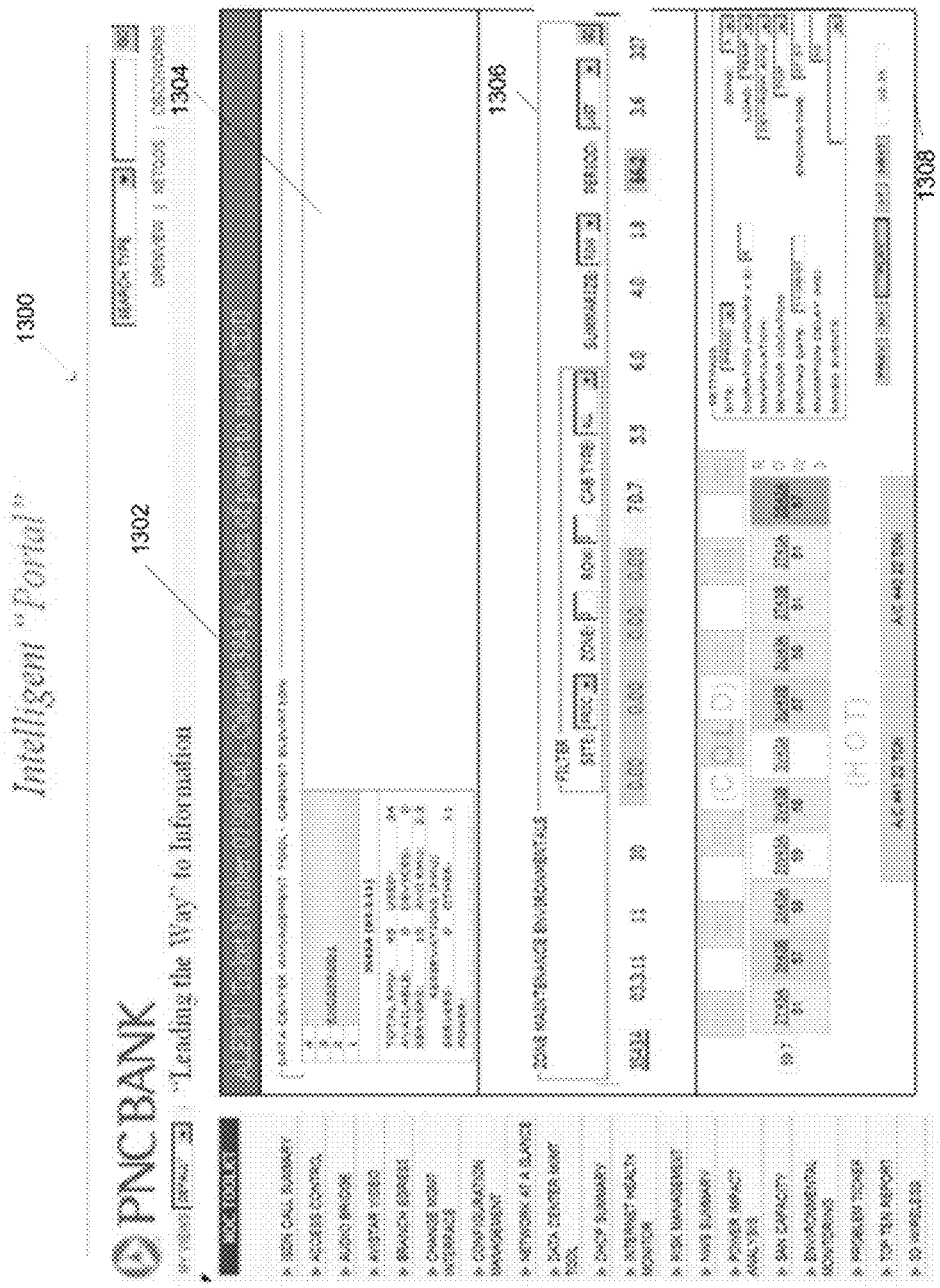
FIG. 13 illustrates one embodiment of a user interface showing an alert ticket.

According to various embodiments the alert ticket may present multiple functionalities in a single interface. For example, FIG. 13 illustrates one embodiment of a user interface 1300 showing an alert ticket. The interface 1300 may comprise a field 1104 indicating a ticket number, the affected system component and the nature of the problem. For example, the ticket shown by interface 1300 is regarding the loss of power to a CDU 114.

The interface 1300 may also include an environmental field 1106 including environmental information that may be sensed or derived from various temperature probes 116, CDU's 114 and other sensors, for example, as described herein. An animation field 1308 may display an animation of temperature, current, power or some other variable, for example, as described above with respect to FIGS. 5*a-c*, 6*a-c* and 7*a-c*. Various other information may be included in the interface 1300 including, for example, a power impact analysis based on the system component that caused the anomalous event.

According to various embodiments, the specific functionalities presented by a single alert ticket may be determined based on a recipient of the alert ticket. For example, an alert ticket sent to a technician may include rich information describing the anomaly in a high level of detail. For example, animations and power impact analyses may be presented at the cabinet or even the individual component level. On the other hand, an alert ticket sent to a server room manager or other administrator may include more general, high-level information. For example, animations and power impact analyses may be presented at the zone or even server room level.

As used herein, a "computer" or "computer system" may be, for example and without limitation, either alone or in combination, a personal computer (PC), server-based computer, main frame, server, microcomputer, minicomputer, laptop, personal data assistant (PDA), cellular phone, pager, processor, including wireless and/or wireline varieties thereof, and/or any other computerized device capable of configuration for processing data for standalone application and/or over a networked medium or media. Computers and computer systems disclosed herein may include operatively associated memory for storing certain software applications used in obtaining, processing, storing and/or communicating data. It can be appreciated that such memory can be internal, external, remote or local with respect to its operatively associated computer or computer system. Memory may also include any means for storing software or other instructions including, for example and without limitation, a hard disk, an optical disk, floppy disk, ROM (read only memory), RAM (random access memory), PROM (programmable ROM), EEPROM (extended erasable PROM), and/or other like computer-readable media.

While several embodiments of the invention have been described, it should be apparent that various modifications, alterations and adaptations to those embodiments may occur to persons skilled in the art with the attainment of some or all of the advantages of the present invention. It is therefore intended to cover all such modifications, alterations and adaptations without departing from the scope and spirit of the present invention.

We claim:

1. A computer-implemented method of managing computer equipment, the method comprising:
    receiving with a server data indicating power dissipated by computer equipment in a portion of the server room, wherein the server comprises at least one processor and an operatively associated memory comprising computer-readable instructions to be executed by the at least one processor, wherein the computer equipment is positioned in a plurality of cabinets arranged in rows defining alternating cold and hot aisles therebetween, wherein airflow through the portion of the server room circulates from floor portions of the cold aisles, through the cabinets to warm air returns positioned near ceiling portions of the hot air aisles;
    receiving with the server data indicating an actual airflow through the portion of the server room;
    calculating with the server a target airflow in the portion of the server room considering the power dissipated by computer equipment in the portion of the server room and an expected difference in temperature between at least one hot aisle and at least one cold aisle in the portion of the server room;
    calculating with the server a recommended action for reaching the target airflow, wherein the recommended action comprises at least one action selected from the group consisting of: changing a static pressure generated by at least one cooling unit servicing the portion of the server room; changing a number of perforated tiles present in the portion of the server room; and changing the type of one or more perforated tiles present in the portion of the server room; and
    using the server to display the recommended action.

2. The method of claim 1, further comprising receiving with the server data indicating a static pressure generated by at least one cooling unit in a portion of a server room and calculating the data indicating the actual airflow considering the static pressure and a number and type of perforated tiles present in the portion of the server room.

3. The method of claim 1, wherein the data indicating the actual airflow is received from at least one airflow sensor in communication with the server.

4. The method of claim 1, further comprising receiving with the server data indicating the expected difference in temperature from a user.

5. The method of claim 1, further comprising displaying with the server a curve illustrating a relationship between the difference in temperature and airflow for the given power dissipated.

6. The method of claim 1, further comprising receiving an adjusted power from a user, and using the server to recalculate the recommended action considering the adjusted power.

7. A system for managing computer equipment, the system comprising a server comprising at least one processor and operatively associated memory having instructions thereon that when implemented by the at least one processor cause the server to:

receive data indicating a power dissipated by computer equipment in a portion of the server room, wherein the computer equipment is positioned in a plurality of cabinets arranged in rows defining alternating cold and hot aisles therebetween, wherein airflow through the portion of the server room circulates from floor portions of the cold aisles, through the cabinets to warm air returns positioned near ceiling portions of the hot air aisles;

receive data indicating an actual airflow through the portion of the server room;

calculate a target airflow in the portion of the server room considering the power dissipated by computer equipment in the portion of the server room and an expected difference in temperature between at least one hot aisle and at least one cold aisle in the portion of the server room;

calculate a recommended action for reaching the target airflow, wherein the recommended action comprises at least one action selected from the group consisting of: changing a static pressure generated by at least one cooling unit servicing the portion of the server room; changing a number of perforated tiles present in the portion of the server room; and changing the type of one or more perforated tiles present in the portion of the server room; and display the recommended action.

8. The system of claim 7, wherein the at least one processor is further programmed to receive the expected difference in temperature from a user.

9. The system of claim 7, wherein the at least one processor is further programmed to display a curve illustrating a relationship between the difference in temperature and airflow for the given power dissipated.

10. The system of claim 7, wherein the at least one processor is further programmed to receive an adjusted power from a user, and recalculating the recommended action considering the adjusted power.

11. A non-transitory computer-readable medium having instructions thereon that when executed by at least one processor, cause the at least one processor to:

receive data indicating a power dissipated by computer equipment in a portion of the server room, wherein the computer equipment is positioned in a plurality of cabinets arranged in rows defining alternating cold and hot aisles therebetween, wherein airflow through the portion of the server room circulates from floor portions of the cold aisles, through the cabinets to warm air returns positioned near ceiling portions of the hot air aisles;

receive data indicating an actual airflow through the portion of the server room;

calculate a target airflow in the portion of the server room considering the power dissipated by computer equipment in the portion of the server room and an expected difference in temperature between at least one hot aisle and at least one cold aisle in the portion of the server room;

calculate a recommended action for reaching the target airflow, wherein the recommended action comprises at least one action selected from the group consisting of: changing a static pressure generated by at least one cooling unit servicing the portion of the server room; changing a number of perforated tiles present in the portion of the server room; and changing the type of one or more perforated tiles present in the portion of the server room; and display the recommended action.

12. A computer-implemented method of managing computer equipment, the method comprising:

receiving with a server data indicating a power dissipated by computer equipment in the portion of the server room, wherein the server comprises at least one processor and an operatively associated memory comprising computer-readable instructions to be executed by the at least one processor, wherein the computer equipment is positioned in a plurality of cabinets arranged in rows defining alternating cold and hot aisles therebetween, wherein airflow through the portion of the server room circulates from floor portions of the cold aisles, through the cabinets to warm air returns positioned near ceiling portions of the hot air aisles;

receiving with the server data indicating an actual airflow through the portion of the server room;

calculating with the server a target airflow considering the power dissipated by computer equipment in the portion of the server room, and a difference in temperature between hot and cold aisles in the portion of the server room;

calculating a recommended action for reaching the target airflow; and implementing the recommended action, wherein the recommended action comprises at least one action selected from the group consisting of: modifying a parameter of at least one cooling unit servicing the portion of the server room and modifying a state of at least one perforated tile present in the portion of the server room.

13. The method of claim 12, wherein a perforated tile selected from the at least one perforated tile has a mechanically adjustable airflow rate and comprises an electric motor configured to mechanically adjust the airflow rate.

14. The method of claim 12, wherein modifying a parameter of at least one cooling unit comprises modifying a static pressure generated by the cooling unit.

15. The method of claim 12, further comprising receiving data indicating a static pressure generated by at least one cooling unit in a portion of a server room, wherein the indication of actual airflow is calculated considering the static pressure and a number and type of perforated tiles present in the portion of the server room.

16. The method of claim 12, further comprising receiving data indicating a static pressure generated by at least one cooling unit in a portion of a server room, wherein the indication of actual airflow is calculated considering the static pressure and a number and type of perforated tiles present in the portion of the server room.

17. The method of claim 12, wherein the data indicating the actual airflow is received from at least one airflow sensor.

18. The method of claim 12, further comprising receiving data indicating the expected difference in temperature from a user.

19. The method of claim 12, further comprising displaying using the server a curve illustrating a relationship between the difference in temperature and airflow for the given power dissipated.

20. The method of claim 12, further comprising receiving data indicating an adjusted power from a user, and recalculating the recommended action considering the adjusted power.

21. A system of managing computer equipment, the system comprising a server comprising at least one processor and operatively associated memory having instructions thereon that when implemented by the at least one processor cause the server to:
- receive data indicating a power dissipated by computer equipment in the portion of the server room, wherein the computer equipment is positioned in a plurality of cabinets arranged in rows defining alternating cold and hot aisles therebetween, wherein airflow through the portion of the server room circulates from floor portions of the cold aisles, through the cabinets to warm air returns positioned near ceiling portions of the hot air aisles;
- receive data indicating an actual airflow through the portion of the server room;
- calculate a target airflow considering the power dissipated by computer equipment in the portion of the server room, and a difference in temperature between hot and cold aisles in the portion of the server room;
- calculate a recommended action for reaching the target airflow; and
- implement the recommended action, wherein the recommended action comprises at least one action selected from the group consisting of: modifying a parameter of at least one cooling unit servicing the portion of the server room and modifying a state of at least one perforated tile present in the portion of the server room.

22. The system of claim 21, wherein a perforated tile selected from the at least one perforated tile has a mechanically adjustable airflow rate and comprises an electric motor configured to mechanically adjust the airflow rate.

23. The system of claim 21, wherein modifying a parameter of at least one cooling unit comprises modifying a static pressure generated by the cooling unit.

24. The system of claim 21, wherein the associated memory further comprises instructions that cause the server to receive data indicating a static pressure generated by at least one cooling unit in a portion of a server room, wherein the data indicating actual airflow is calculated considering the static pressure and a number and type of perforated tiles present in the portion of the server room.

25. A non-transitory computer-readable medium having instructions thereon that when executed by at least one processor cause the at least one processor to:
- receive data indicating a power dissipated by computer equipment in the portion of the server room, wherein the computer equipment is positioned in a plurality of cabinets arranged in rows defining alternating cold and hot aisles therebetween, wherein airflow through the portion of the server room circulates from floor portions of the cold aisles, through the cabinets to warm air returns positioned near ceiling portions of the hot air aisles;
- receive data indicating an actual airflow through the portion of the server room;
- calculate a target airflow considering the power dissipated by computer equipment in the portion of the server room, and a difference in temperature between hot and cold aisles in the portion of the server room;
- calculate a recommended action for reaching the target airflow; and
- implement the recommended action, wherein the recommended action comprises at least one action selected from the group consisting of: modifying a parameter of at least one cooling unit servicing the portion of the server room and modifying a state of at least one perforated tile present in the portion of the server room.

26. A system for managing computer equipment, the system comprising:
- means for receiving data indicating a power dissipated by computer equipment in a portion of the server room, wherein the computer equipment is positioned in a plurality of cabinets arranged in rows defining alternating cold and hot aisles therebetween, wherein airflow through the portion of the server room circulates from floor portions of the cold aisles, through the cabinets to warm air returns positioned near ceiling portions of the hot air aisles;
- means for receiving data indicating an actual airflow through the portion of the server room;
- means for calculating a target airflow in the portion of the server room considering the power dissipated by computer equipment in the portion of the server room and an expected difference in temperature between at least one hot aisle and at least one cold aisle in the portion of the server room;
- means for calculating a recommended action for reaching the target airflow, wherein the recommended action comprises at least one action selected from the group consisting of: changing a static pressure generated by at least one cooling unit servicing the portion of the server room; changing a number of perforated tiles present in the portion of the server room; and changing the type of one or more perforated tiles present in the portion of the server room; and
- means for displaying the recommended action.

27. A system for managing computer equipment, the system comprising:
- means for receiving data indicating a power dissipated by computer equipment in the portion of the server room, wherein the computer equipment is positioned in a plurality of cabinets arranged in rows defining alternating cold and hot aisles therebetween, wherein airflow through the portion of the server room circulates from floor portions of the cold aisles, through the cabinets to warm air returns positioned near ceiling portions of the hot air aisles;
- means for receiving data indicating an actual airflow through the portion of the server room;
- means for calculating a target airflow considering the power dissipated by computer equipment in the portion of the server room, and a difference in temperature between hot and cold aisles in the portion of the server room;
- means for calculating a recommended action for reaching the target airflow; and
- means for implementing the recommended action, wherein the recommended action comprises at least one action selected from the group consisting of: modifying a parameter of at least one cooling unit servicing the portion of the server room and modifying a state of at least one perforated tile present in the portion of the server room.

* * * * *